United States Patent
Chen et al.

(10) Patent No.: US 11,658,201 B2
(45) Date of Patent: May 23, 2023

(54) DUAL CONVERSION GAIN IMAGE SENSOR PIXELS

(71) Applicant: Silead Inc., Shanghai (CN)

(72) Inventors: Gang Chen, San Jose, CA (US); Zhi Hao, Shanghai (CN); Yi Zhang, Shanghai (CN)

(73) Assignee: SILEAD INC., Shanghai (CN)

( * ) Notice: Subject to any disclaimer, the term of this patent is extended or adjusted under 35 U.S.C. 154(b) by 0 days.

(21) Appl. No.: 17/411,531

(22) Filed: Aug. 25, 2021

(65) Prior Publication Data

US 2023/0064181 A1   Mar. 2, 2023

(51) Int. Cl.
| | |
|---|---|
| H04N 5/355 | (2011.01) |
| H01L 27/146 | (2006.01) |
| H04N 5/3745 | (2011.01) |
| H01L 27/148 | (2006.01) |

(52) U.S. Cl.
CPC .. *H01L 27/14643* (2013.01); *H01L 27/14603* (2013.01); *H01L 27/14612* (2013.01); *H01L 27/14831* (2013.01); *H04N 5/3559* (2013.01); *H04N 5/3745* (2013.01)

(58) Field of Classification Search
None
See application file for complete search history.

(56) References Cited

U.S. PATENT DOCUMENTS

| | | | |
|---|---|---|---|
| 6,246,436 B1 * | 6/2001 | Lin | H04N 5/37452 |
| | | | 348/E3.018 |
| 7,075,049 B2 | 7/2006 | Rhodes et al. | |
| 7,282,754 B2 | 10/2007 | Lee | |
| 7,531,858 B2 | 5/2009 | Lee | |

(Continued)

FOREIGN PATENT DOCUMENTS

| | | |
|---|---|---|
| CN | 1833429 A | 9/2006 |
| CN | 110781868 A | 2/2020 |

(Continued)

OTHER PUBLICATIONS

Mizobuchi, Koichi, et al., "4.5 μm Pixel Pitch 154 ke—Full Well Capacity CMOS Image Sensor", In Proceedings of the International Image Sensor Workshop, Bergen, Norway, Jun. 25-28, 2009, 4 pages.

*Primary Examiner* — Twyler L Haskins
*Assistant Examiner* — Wesley J Chiu
(74) *Attorney, Agent, or Firm* — Haynes and Boone, LLP

(57) ABSTRACT

An image sensor includes an image sensor pixel array having pixels. Each pixel includes a continuous active region having a first portion and a second portion extending from the first portion. A photodiode, a reset transistor, a drive transistor, and a select transistor are formed in and over the first portion. The photodiode and the reset transistor define a floating diffusion region therebetween. A switch transistor is formed in and over the second portion and includes a first source/drain region and a second source/drain region. The first source/drain region is included in the floating diffusion region. The second source/drain region interfaces a doped region formed in the second region. The pixel also includes a gate structure disposed directly over the doped region. By controlling the switch transistor, the pixel may operate in a high conversion gain mode or a low conversion gain mode to accommodate different illumination or exposure conditions.

17 Claims, 13 Drawing Sheets

(56) References Cited

U.S. PATENT DOCUMENTS

| | | | |
|---|---|---|---|
| 7,557,846 B2 | 7/2009 | Ohkawa | |
| 7,825,438 B2 | 11/2010 | Jung et al. | |
| 7,884,401 B2 | 2/2011 | Shim | |
| 8,076,702 B2 | 12/2011 | Lim | |
| 8,633,431 B2 | 1/2014 | Kim | |
| 9,293,503 B2* | 3/2016 | Sakano | H01L 27/14643 |
| 9,673,236 B2 | 6/2017 | Jin et al. | |
| 10,559,614 B2 | 2/2020 | Oh | |
| 2004/0251394 A1* | 12/2004 | Rhodes | H04N 5/35572 |
| | | | 348/E3.019 |
| 2006/0046338 A1* | 3/2006 | Patrick | H01L 27/14689 |
| | | | 438/57 |
| 2012/0256077 A1* | 10/2012 | Yen | H01L 27/14609 |
| | | | 250/208.1 |
| 2014/0054445 A1* | 2/2014 | Kikuchi | H01L 27/146 |
| | | | 257/443 |
| 2017/0214878 A1* | 7/2017 | Van Der Tempel | |
| | | | H04N 5/3559 |
| 2018/0103222 A1* | 4/2018 | Yan | H01L 27/14614 |
| 2020/0235151 A1* | 7/2020 | Suzuki | H01L 27/14614 |
| 2020/0278482 A1 | 9/2020 | Smith et al. | |
| 2020/0286945 A1* | 9/2020 | Palaniappan | H01L 27/14612 |
| 2022/0068987 A1* | 3/2022 | Park | H01L 27/14612 |
| 2022/0102401 A1* | 3/2022 | Kwag | H01L 27/14831 |

FOREIGN PATENT DOCUMENTS

| | | |
|---|---|---|
| EP | 1641045 A2 | 3/2006 |
| EP | 1017106 B1 | 1/2011 |

* cited by examiner

DUAL CONVERSION GAIN IMAGE SENSOR PIXELS

BACKGROUND

Biometric recognition systems are developed to image biometric objects for authenticating and/or verifying users of devices incorporating the recognition systems. Fingerprints, like various other biometric characteristics, may be used to identify an individual based on distinctive personal characteristics. Image sensors that can recognize fingerprints may be used to provide access control in mobile devices, such as cell phones, wearable smart devices, tablet computers, etc.

An image sensor may include an array of pixels and circuits coupled to the array of pixels for reading out image signals from the pixels. Each image pixel includes a photosensitive device, such as a photodiode, for generating charges in response to incident light. Image sensors may need to cater wide ranges of screen types, personal finger conditions, temperatures, and/or humidity conditions. Although existing technologies for image sensors have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
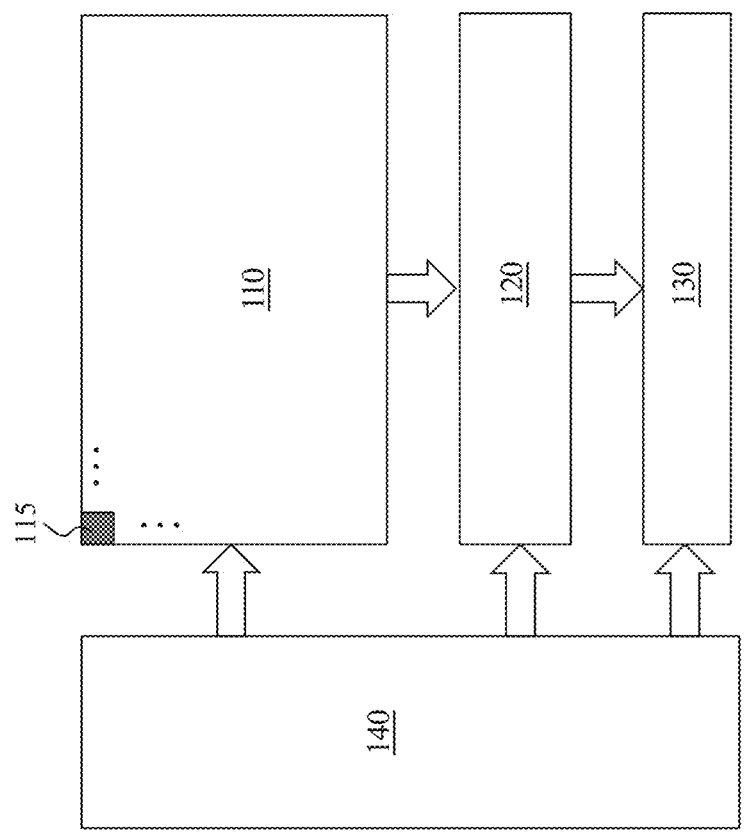
FIG. 1 depicts a block diagram illustrating an exemplary image sensor, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For avoidance of doubts, the X direction, the Y direction and the Z direction are perpendicular to one another. Throughout the present disclosure, like reference numerals denote like features unless otherwise noted.

The present disclosure is generally related to image sensors, and more particularly to complementary metal oxide semiconductor (CMOS) image sensor pixels with dual or multiple conversion gains. The CMOS image sensor pixels may be used for fingerprint recognition or other suitable implementations. The present disclosure includes multiple embodiments. Different embodiments may have different advantages, and no particular advantage is necessarily required of any embodiment. In an embodiment, a pixel includes a continuous active region having a first portion and a second portion extending from the first portion. A photodiode, a reset transistor, a drive transistor, and a select transistor are formed in and over the first portion. The photodiode and the reset transistor define a floating diffusion region therebetween. A switch transistor is formed in and over the second portion and includes a first source/ drain region and a second source/drain region. The first source/drain region is included in the floating diffusion region. The second source/drain region interfaces a doped region formed in the second region. By controlling the switch transistor, the pixel may operate in a high conversion gain mode or a low conversion gain mode to accommodate different illumination or exposure conditions. The pixel also includes a gate structure disposed directly over the doped region. With a MOS capacitor formed by the doped region and the gate structure, the pixel may have an even lower conversion gain. In some other embodiments, a positive voltage may be applied to the gate electrode of the MOS capacitor such that more charges can be transferred out from the photodiode, leading to an enhanced charge transferring from the photodiode to the floating diffusion region.

The various aspects of the present disclosure will now be described in more detail with reference to the figures. In that regard, FIG. 1 depicts a block diagram illustrating an exemplary image sensor (or image sensor device) 100. The image sensor 100 includes a pixel array 110 containing pixels 115 arranged in rows and columns. In some embodiments, the pixel array 110 may include hundreds or thousands of rows and hundreds or thousands of columns of pixels 115. An equivalent circuit diagram of the pixel 115 is described in detail with reference to FIG. 2.

The image sensor 100 also includes an analog-to-digital converting (ADC) unit 120 coupled to the pixel array 110. The ADC unit 120 may convert an analog signal output from the pixel array 110 into a digital signal. According to exemplary embodiments, the ADC unit 120 may perform a column ADC that converts analog signals in parallel using a plurality of analog-to-digital converters respectively coupled to a plurality of column lines. In other embodiments, the ADC unit 120 may perform a single ADC that sequentially converts the analog signals. In some embodiments, the ADC unit 120 may also include a correlated double sampling (CDS) unit for extracting an effective signal component. In some embodiments, the CDS unit may perform an analog double sampling that extracts the effective signal component based on a difference between an analog reset signal including a reset component and an analog data signal including a signal component. In other embodiments, the CDS unit may perform a digital double sampling that converts the analog reset signal and the analog data signal into two digital signals and extracts the effective signal component based on a difference between the two digital signals. In still other embodiments, the CDS unit may perform a dual correlated double sampling that performs both the analog double sampling and the digital double sampling. The ADC unit 120 may also include other suitable configurations, such as a programmable gain amplifier (PGA) circuit configured to amplify the analog reset signal and the analog data signal before sending the analog reset signal and the analog data signal to the CDS unit for double sampling.

The image sensor 100 also includes a digital signal processing (DSP) unit 130. The DSP unit 130 may receive the digital signal output from the ADC unit 120 and may perform image data processing on the digital signal. For example, the DSP unit 130 may perform image interpolation, color correction, white balance, color conversion, etc. Although FIG. 1 illustrates an example where the DSP unit 130 is included in the image sensor 100, according to other embodiments, the DSP unit 130 may be located outside the image sensor 100.

The image sensor 100 also includes a control unit 140. The control unit 140 may control the pixel array 110, the ADC unit 120, and the DSP unit 130. The control unit 140 may provide the pixel array 110, the ADC unit 120, and the DSP unit 130 with control signals, such as a clock signal, a timing control signal, etc. In some embodiments, the control unit 140 may include a control logic circuit, a phase locked loop circuit, a timing control circuit, a communication interface circuit, etc. Although not shown, the image sensor 100 may also include a row decoder that selects a row line of the pixel array 110 and a row driver that activates the selected row line. In some embodiments, the image sensor 100 may further include a column decoder that selects one of a number of analog-to-digital converters included in the ADC unit 120, and a column driver for providing an output of the selected analog-to-digital converter to the DSP unit 130 or an external host.

Figure 2:
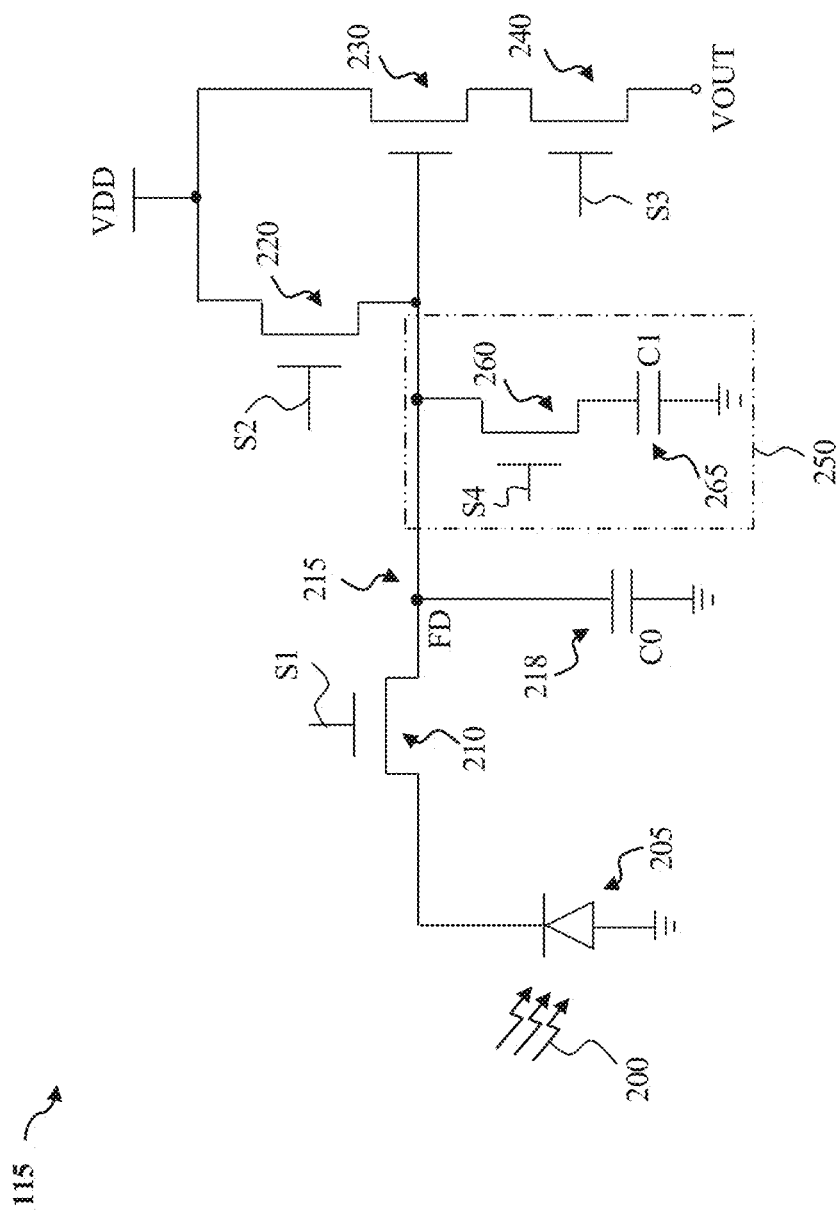
FIG. 2 illustrates an equivalent circuit diagram of a pixel having dual conversion gain, according to various aspects of the present disclosure.

FIG. 2 illustrates an exemplary equivalent circuit diagram of the pixel 115 having dual conversion gain, according to various aspects of the present disclosure. The pixel 115 includes a photosensitive device 205 (e.g., photodiode 205) configured to generate charges in response to incident light 200. The amount of charges that is generated by photodiode 205 may depend on the intensity of the incident light 200 and/or the exposure duration. As shown in FIG. 2, the photodiode 205 has a first terminal coupled to a reference voltage (e.g., a ground voltage GND) and a second terminal coupled to a transfer transistor 210. The transfer transistor 210 is configured to transfer charges generated by the photodiode 205. In this depicted example, the transfer transistor 210 includes a gate terminal, a first source/drain terminal, and a second source/drain terminal. The first source/drain terminal of the transfer transistor 210 is electrically connected to the second terminal of the photodiode 205. The second source/drain terminal of the transfer transistor 210 is electrically connected to a floating diffusion region (FD) 215. The FD 215 includes a native junction capacitor 218 configured to store at least a portion of the charges transferred by the transfer transistor 210. The capacitor 218 has a capacitance C0. It is noted that, the gate terminal of the transfer transistor 210 is controlled by a control signal S1 such that the charges generated by the photodiode 205 may be controllably transferred to the FD 215.

As shown in FIG. 2, the pixel 115 also includes a reset transistor 220. In this depicted example, the reset transistor 220 includes a gate terminal, a first source/drain terminal, and a second source/drain terminal. The first source/drain terminal of the reset transistor 220 is electrically connected to a positive power supply voltage VDD, the second source/drain terminal of the reset transistor 220 is electrically connected to the FD 215, and the gate terminal of the reset transistor 220 is configured to receive a reset signal S2 such that the reset transistor 220 may be turned on and off to reset the FD 215 to a voltage equal to or close to the positive power supply voltage VDD in response to the reset signal S2. In situations where the transfer transistor 210 is turned on, the reset transistor 220 resets the photodiode 205 as well as the FD 215.

The pixel 115 also includes a drive transistor 230. A first source/drain terminal of the drive transistor 230 is electrically connected to the positive power supply voltage VDD, the gate terminal of the drive transistor 230 is electrically connected to the FD 215. The drive transistor 230, acting as a source follower, amplifies the charges stored in the FD 215 to achieve the charge-voltage conversion.

The pixel 115 also includes a select transistor 240 (e.g., a row select transistor for selecting a row of pixels 115 for operation). A first source/drain terminal of the select transistor 240 is electrically connected to a second source/drain terminal of the drive transistor 230 and a gate terminal of the select transistor 240 is configured to receive a unit pixel selection signal S3 such that the select transistor 240 provides an output signal VOUT of the drive transistor 230 in response to the unit pixel selection signal S3.

The photodiode 205 may generate more charges due to, for example, a long exposure duration or a bright illumination light. However, a portion of the generated charges may not be accommodated by the FD 215 due to the limited capacity of the FD 215. Thus, a low conversion gain may be needed, and an additional capacitor may be used to store at least a portion of the charges generated by the photodiode 205. In embodiments represented in FIG. 2, the pixel 115 includes a dual conversion gain circuit 250 electrically coupled to the FD 215. As shown in the equivalent circuit diagram in FIG. 2, the dual conversion gain circuit 250 is electrically connected to the native junction capacitor 218 of the FD 215 in parallel. More specifically, the dual conversion gain circuit 250 includes a dual conversion gain switch 260 having a first source/drain terminal electrically coupled to the FD 215, a second source/drain terminal electrically coupled to a capacitor 265, and a gate terminal configured to receive a gain control signal S4 such that the pixel 115 may operate in a high conversion gain mode or a low conversion gain mode in response to the gain control signal S4. In an embodiment, the capacitor 265 includes a junction capacitor and has a capacitance C1. The capacitance C1 of the capacitor 265 may be equal to or different than the capacitance C0 of the capacitor 218 in some embodiments.

When the dual conversion gain switch 260 is turned off by the gain control signal S4, the charges transferred by the transfer transistor 210 may be stored in the capacitor 218, and the pixel 115 has a first conversion gain. When the dual conversion gain switch 260 is turned on by the gain control signal S4, the capacitor 265 is coupled to the FD 215, providing the FD 215 with an additional capacitance C1. That is, the total capacitance is equal to a sum of the capacitance C0 of capacitor 218 and the capacitance C1 of capacitor 265 (i.e., C0+C1). The charges transferred by the transfer transistor 210 may be stored in the capacitor 218 and the capacitor 265. That is, once the capacitor 265 is coupled to the FD 215, the conversion gain will decrease from the first conversion gain to a second conversion gain. The second conversion gain is lower than the first conversion gain. The first conversion gain may be referred to as a high conversion gain. The second conversion gain may be referred to as a low conversion gain. Accordingly, by turning on and off the conversion gain switch 260, the conversion gain may be altered and the pixel 115 may operate in a high conversion gain mode or a low conversion gain mode to cater different illumination or exposure conditions. It is noted that, although the transistors 210, 220, 230, 240, and 260 in the pixel 115 shown in FIG. 2 include N-type metal-oxide-semiconductor field-effect transistors (NMOS-FETs), in some other implementations, one or more of these transistors may include P-type MOSFETs, for example, for hole detectors.

Figure 3:
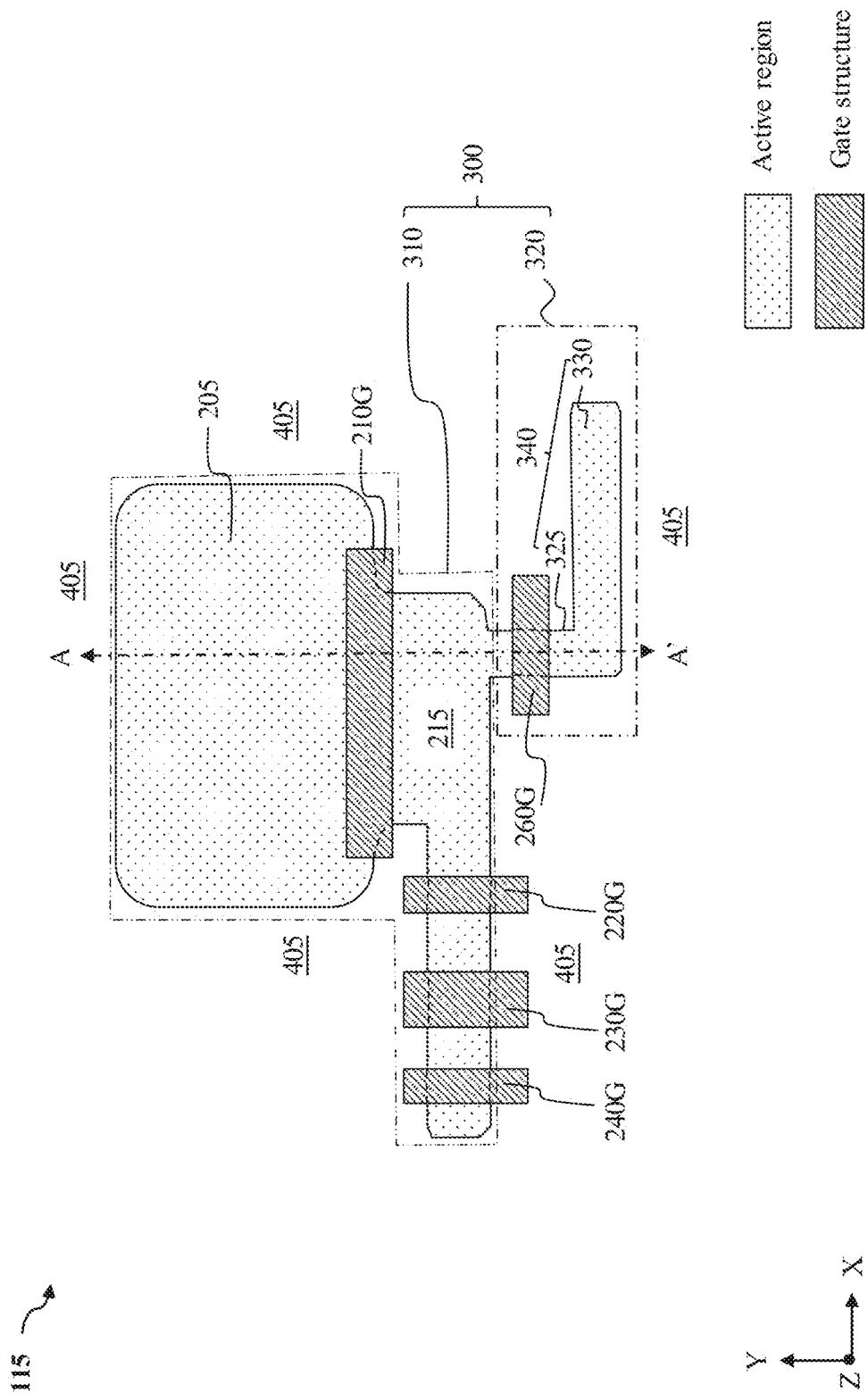
FIG. 3 depicts an exemplary layout of the pixel, according to various aspects of the present disclosure.

FIG. 3 depicts an exemplary layout of the pixel 115 shown in FIG. 2, according to an embodiment. The pixel 115 includes a continuous active region 300 over a substrate 305 (shown in FIG. 4). Here, the active region includes regions where semiconductor devices (e.g., transistors, photodiodes) are to be formed in and/or on. For example, the active region 300 includes source/drain regions and channel regions of transistors. The active region 300 is a continuous active region because it includes a first region 310 and a second region 320 that are connected in a continuous fashion with no isolation structure separating the two regions, where the photodiode and all the transistors and junction capacitors of the pixel 115 are formed in and/or on the first and the second regions 310, 320. In FIG. 3, the first region 310 is the active region enclosed by the dotted polygon pointed to by 310, excluding the area outside of the active region, and the second region 320 is the active region enclosed by the dotted polygon pointed to by 320, excluding the area outside of the active region. The first region 310 may be referred to as a main portion ("main region 310"), and the second region 320 may be referred to as an extension of the main region 310 ("extended region 320"). By forming the active region 300 as a continuous active region described above, the processes for forming the pixel 115 may be simplified and the area that can be used for forming transistors and photodiodes may be increased. The active region 300 is isolated from adjacent active regions (not shown) by an isolation structure 405 (e.g., shallow trench isolation or deep trench isolation).

The photodiode 205, the transfer transistor 210, the FD 215, the reset transistor 220, the drive transistor 230, and the select transistor 240 are formed in and over the first region 310 of the active region 300. As shown in FIG. 3, the corresponding gate structures 210G, 220G, 230G, and 240G of the transfer transistor 210, the reset transistor 220, the drive transistor 230, and the select transistor 240, respectively, are disposed over the first region 310. The photodiode 205 is disposed adjacent to a first side of the gate structure 210G, and the FD 215 is disposed adjacent to a second side of the gate structure 210G, where the second side is opposite to the first side. The FD 215 is further defined between the gate structure 210G and the gate structure 220G. That is, the FD 215 is defined between the photodiode 205 and the gate structure 220G, especially in embodiments where the pixel 115 doesn't include the transfer transistor 210. In an embodiment, the gate structure 210G extends lengthwise along a first direction, and each of the gate structures 220G, 230G, and 240G extends lengthwise along a second direction that is substantially perpendicular to the first direction. In embodiments represented in FIG. 3, the gate structure 210G extends lengthwise along the X direction, and each of the gate structures 220G, 230G, and 240G extends lengthwise along the Y direction. As shown in FIG. 3, the gate structure 210G is disposed adjacent to a first side of the FD 215, the gate structure 220G is disposed adjacent to a second side of the FD 215, and the extended region 320 extends from a third side of the FD 215, where the third side is different from the first side and the second side.

In embodiments represented in FIG. 3, the dual conversion gain circuit 250 (shown in FIG. 2) is formed in and over the extended region 320. A gate structure 260G of the dual conversion gain switch 260 (not separately labeled in FIG. 3) is disposed over the extended region 320. The FD 215 is disposed adjacent to a first side of the gate structure 260G, and a portion 340 of the extended region 320 is disposed adjacent to a second side of the gate structure 260G, where the second side is opposite to the first side. The gate structure 260G is disposed between the FD 215 and the portion 340. The portion 340 includes a first portion 325 and a second portion 330. In embodiments represented in FIG. 3, the first portion 325 extends lengthwise along the Y direction and may thus be referred to as a vertical portion 325, the second portion 330 extends lengthwise along the X direction and may be referred to as a horizontal portion 330. It is noted that, a shape of a top view of the portion 340 may be adjusted to fulfill different design requirements. The present disclosure is not limited to any particular shape of the portion 340. When the pixel 115 works in the low conversion gain mode, in addition to the junction capacitor 218 of the FD 215, the portion 340 also introduces the junction capacitor 265 (shown in FIG. 2) having the capacitance C1 and configured to store at least a portion of the charges transferred by the transfer transistor 210. It is noted that, in this embodiment, the conversion gain switch 260 is not disposed between the reset transistor 220 and the FD 215. Therefore, in situations where the conversion gain switch 260 is turned off, when the reset transistor 220 is turned on and off to reset the FD 215 (and as well as the photodiode 205 if the transfer transistor 210 is turned on), the capacitor 265 (shown in FIG. 2) of the dual conversion gain circuit 250 would not be charged and discharged. Accordingly, the arrangement of the conversion gain switch 260 and the capacitor 265 in this layout would not affect the operation speed of the pixel 115, which is advantageous for the stable and reliable operation of the pixel 115.

In the example depicted in FIG. 3, the main region 310 of the continuous active region 300 for hosting the FD 215 and the transistors 220, 230, and 240 (where the gate structures 220G, 230G, and 240G reside) is formed as a bent structure and extends to the −X direction (opposite to the X direction), and the extended region 320 of the continuous active region 300 for hosting the dual conversion gain circuit 250 (including gate structure 260G and the capacitance C1) is formed as a bent structure and the horizontal portion 330 extends to the X direction. With this arrangement, a pixel with a small area may be achieved. In some implementations, the entirety of the extended region 320 of the continuous active region 300 may extend longwise along the X direction. In other words, the extended region 320 may extend horizontally from the main region 310 and does not have the vertical portion 325.

Although the contacts (or vias) and metal lines are omitted in FIG. 3 for reason of simplicity, it is understood that a number of contacts and metal lines may be formed such that the pixel 115 may function as described with reference to FIG. 2. For example, a first contact may be formed over the gate structure 230G of the drive transistor 230, and a second contact may be formed over the FD 215, and a metal line may be formed to electrically connect the first contact to the second contact such that the drive transistor 230 may act as a source follower to amplify the charges stored in the FD 215.

Figure 4:
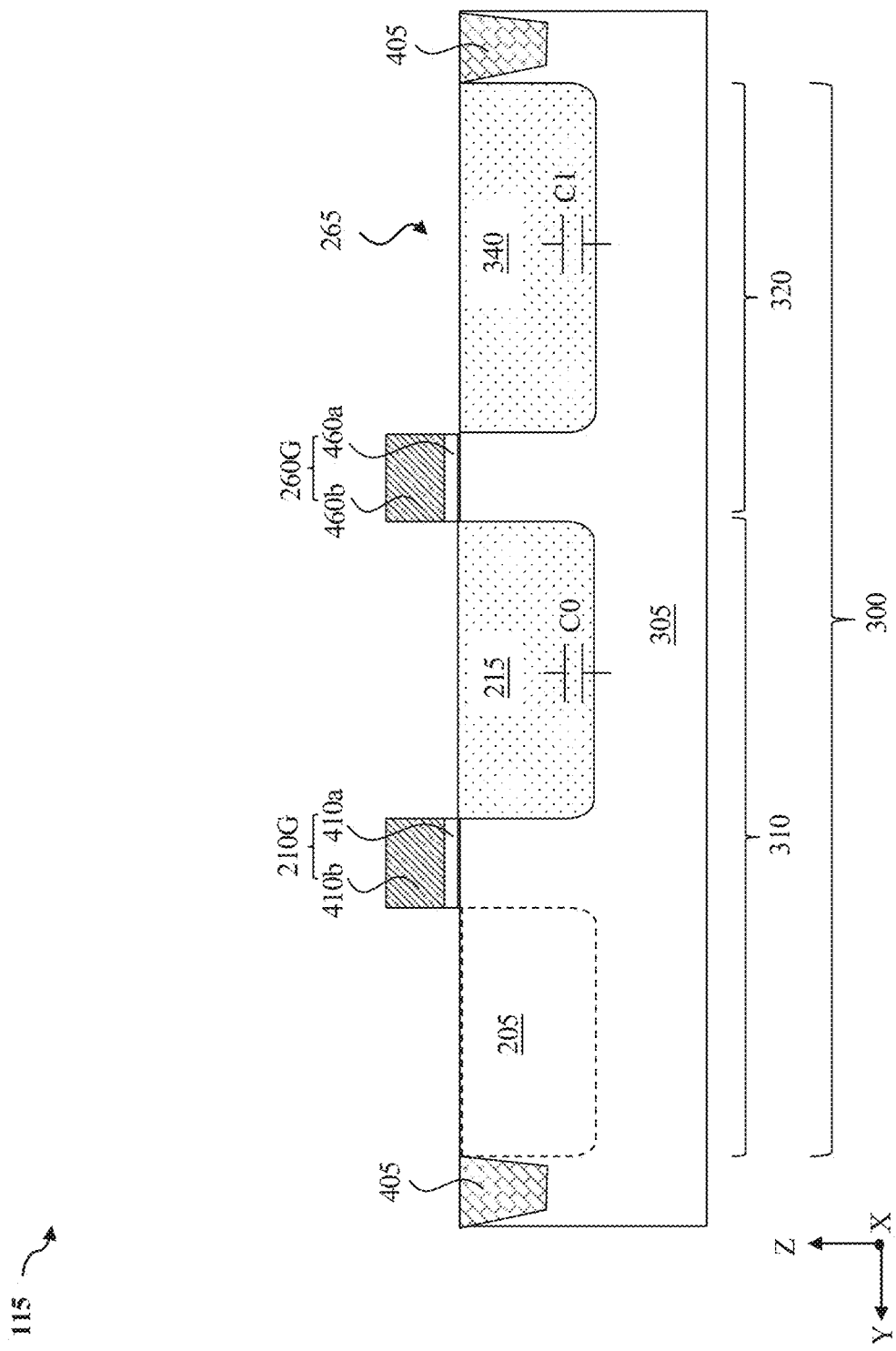
FIG. 4 depicts a cross-sectional view of the pixel taken along line A-A' shown in FIG. 3, according to various aspects of the present disclosure.

FIG. 4 shows a cross-sectional view of the pixel 115 taken along line A-A' shown in FIG. 3. The pixel 115 includes the continuous active region 300 surrounded by isolation structures 405 such that the continuous active region 300 may be isolated from adjacent active regions. The isolation structures 405 may include shallow trench isolation (STI) or other suitable isolation structures such as LOCOS or deep trench isolation (DTI). In some embodiments, the isolation structures 405 may include silicon oxide, silicon oxynitride, fluorine-doped silicate glass (FSG), a low-k dielectric, combinations thereof, and/or other suitable materials.

As shown in FIG. 4, the pixel 115 includes the photodiode 205 formed in the substrate 305. Although not explicitly shown in FIG. 4, the substrate 305 may include an N-type well region (or N well) and/or a P-type well region (or P well) for fabrication of transistors of different conductivity types (i.e., PFET and NFET). In an embodiment, the substrate 305 may be a silicon (Si) substrate. In some other embodiments, the substrate 305 may include other semiconductors such as germanium (Ge), silicon germanium (SiGe), or a III-V semiconductor material. Exemplary III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 305 may also include an insulating layer, such as a silicon oxide layer, to provide a silicon-on-insulator (SOI) structure. When present, each of the N-type well and the P-type well is formed in the substrate 305 and includes one or more dopants. An N-type well may include one or more N-type dopants, such as phosphorus and arsenic. A P-type well may include one or more P-type dopants, such as boron (B) or other P-type dopants. The doping in the N-type well and the P-type well may be formed using ion implantation or thermal diffusion and may be considered portions of the substrate 305.

As shown in FIG. 4, the pixel 115 includes the gate structure 210G disposed over the substrate 305 and adjacent to both the photodiode 205 and the FD 215. The gate structure 210G includes a gate dielectric layer 410a and a gate electrode layer 410b formed on the gate dielectric layer 410a. In some embodiments, the gate structure 210G is formed by various process steps such as layer deposition, patterning, etching, as well as other suitable processing steps. Exemplary layer deposition processes include CVD, PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the gate dielectric layer 410a may include silicon oxide and the gate electrode layer 410b may include polycrystalline silicon (polysilicon). Other suitable materials such as high-k gate dielectric materials and metallic gate electrodes may also be used to form the gate structure 210G.

As shown in FIG. 4, the pixel 115 also includes the FD 215 and the portion 340 of the extended region 320 of the active region 300 in the substrate 305. Both the FD 215 and the portion 340 may be doped with suitable dopant(s). In an embodiment, the transfer transistor 210 includes the gate structure 210G, a part of a doped portion in the photodiode 205, and the FD 215. The pixel 115 also includes the gate structure 260G disposed over the substrate 305 and adjacent to both the FD 215 and the portion 340. The gate structure 260G includes a gate dielectric layer 460a and a gate electrode layer 460b. The formation and composition of the gate structure 260G may be similar to those of the gate structure 210G. In an embodiment, the conversion gain switch 260 includes the gate structure 260G, part of the FD 215, and the portion 340. In the embodiment depicted in FIG. 4, the transfer transistor 210 and the conversion gain switch 260 share the FD 215.

In some embodiments, the substrate 305 is doped with a first type of dopant(s), and the FD 215 and the portion 340 are doped with a second type of dopant(s) that is opposite to the first type. The pixel 115 thus includes the parasitic capacitance C0 associated with the depletion region formed by the FD 215 and the substrate 305 and the parasitic capacitance C1 associated with the depletion region formed by the portion 340 and the substrate 305. In some implementations, the substrate 305 includes a P-type substrate, and the FD 215 and the portion 340 are doped with N-type dopants. In some embodiments, the FD 215 and the portion 340 are doped by a common first doping process after forming the gate structures 210G and 260G. In some embodiments, a doping concentration of the FD 215 is equal to a doping concentration of the portion 340. In an embodiment, the doping concentration of the FD 215 and the portion 340 may be between about 1E13 ions/cm$^2$ and 1E16 ions/cm$^2$. The doping concentrations and the dimensions of the FD 215 and the portion 340 may be tuned to provide desired capacitance C0 and capacitance C1. In some embodiments, after the first doping process, a second doping process may be followed to further dope the portion 340. That is, after the second doping process, a doping concentration of the portion 340 is greater than a doping concentration of the FD 215. The increased doping concentration of the portion 340 leads to an increased parasitic capacitance C1 and thus a lower conversion gain. In some embodiments, after the second doping process, the capacitance C1 may be greater than the capacitance C0.

Figure 5:
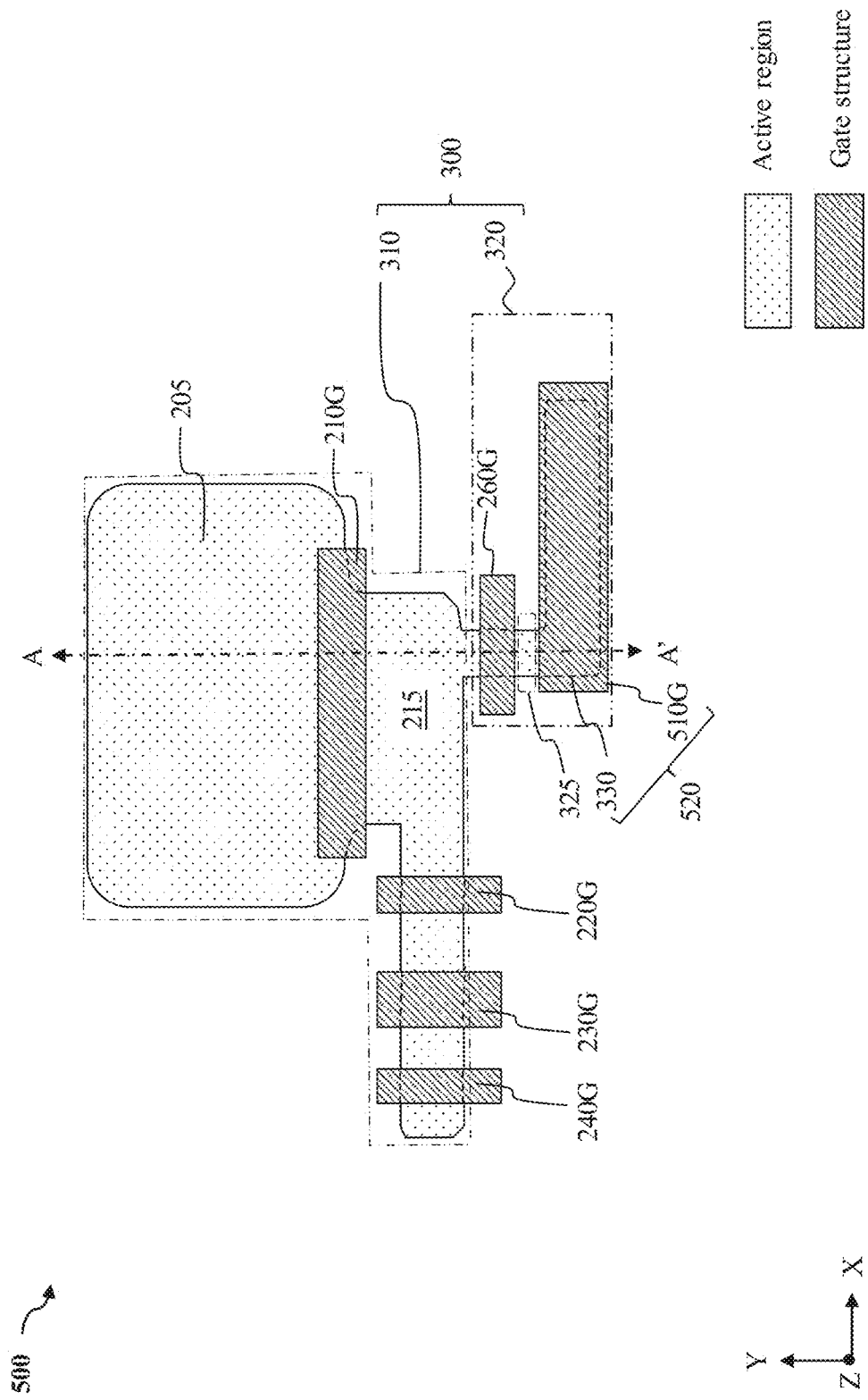
FIG. 5 depicts an exemplary layout of a first alternative pixel, according to various aspects of the present disclosure.
Figure 6:
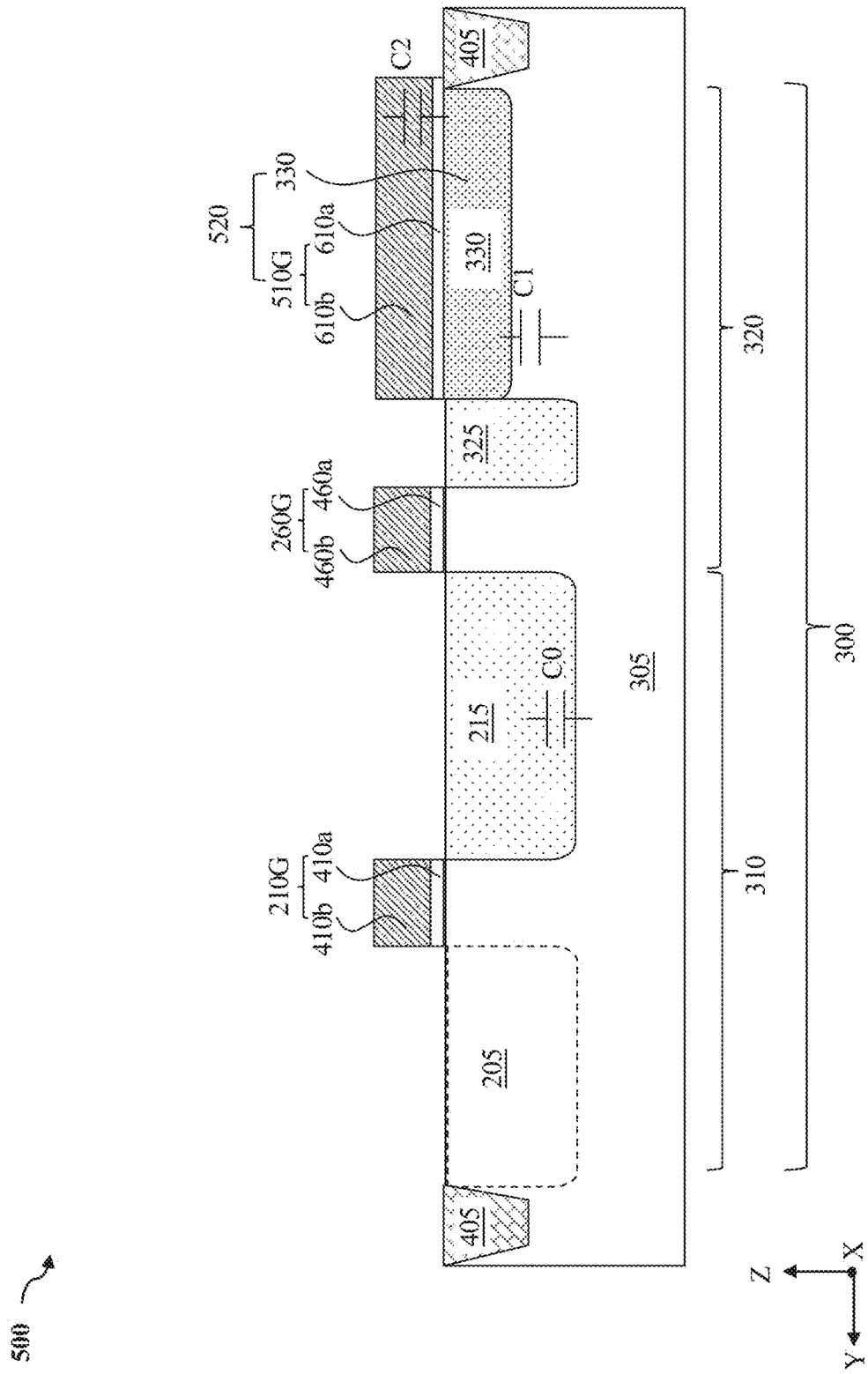
FIG. 6 depicts a cross-sectional view of the first alternative pixel taken along line A-A' shown in FIG. 5, according to various aspects of the present disclosure.
Figure 7:
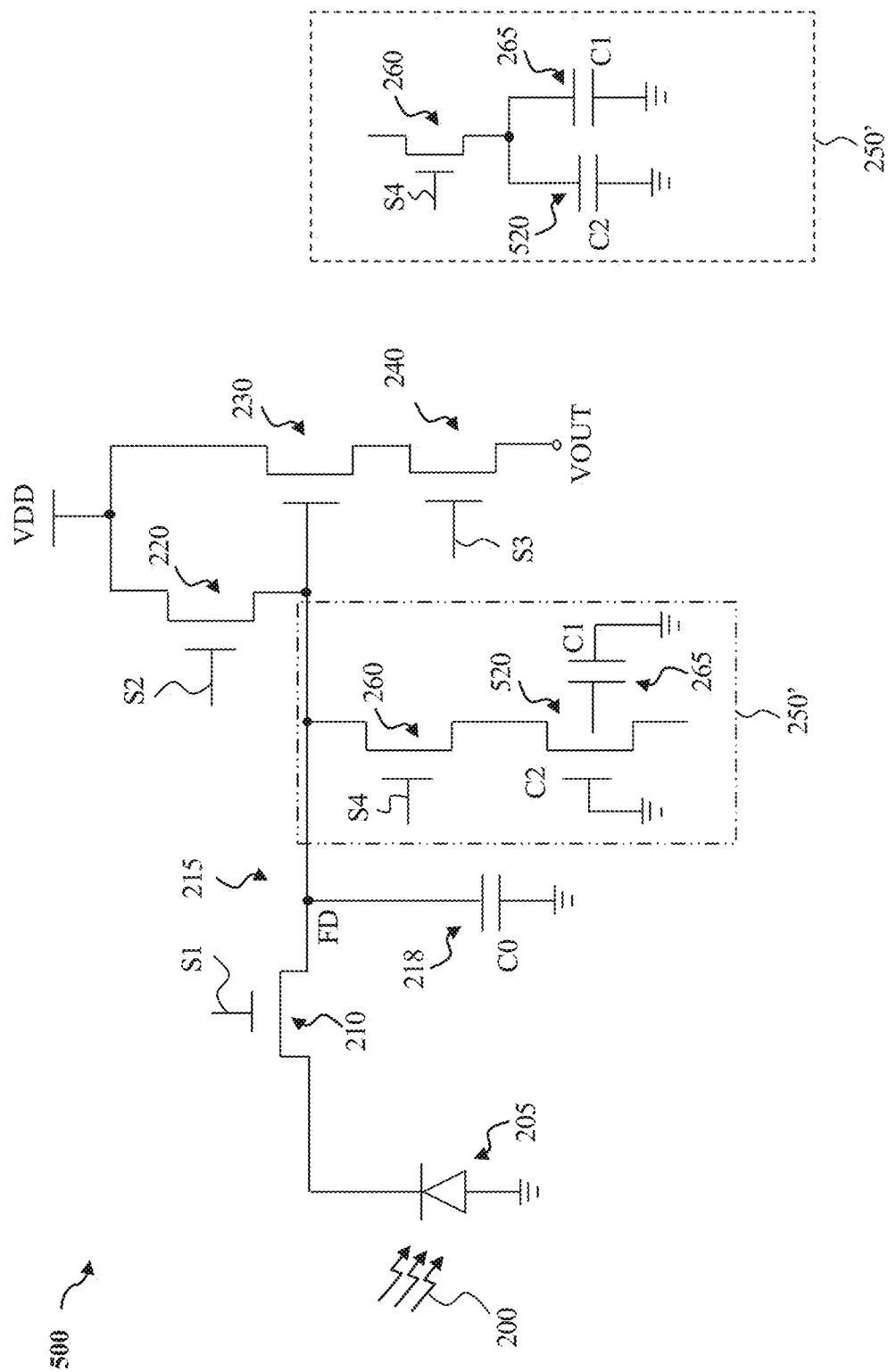
FIG. 7 illustrates an equivalent circuit diagram of the first alternative pixel, according to various aspects of the present disclosure.

In some situations, the additional capacitance to be added to the FD 215 may be further increased to achieve an even lower conversion gain and a higher dynamic range. FIG. 5 depicts an exemplary layout of a first alternative pixel 500 having a lower conversion gain and a higher dynamic range than those of the pixel 115 described above with reference to FIGS. 2-4. FIG. 6 depicts a cross-sectional view of the pixel 500 taken along line A-A' shown in FIG. 5. FIG. 7 illustrates an equivalent circuit diagram of the pixel 500. The pixel 500 in FIGS. 5-7 is similar to the pixel 115 except that the pixel 500 further includes a gate structure 510G disposed over the second portion 330 of the extended region 320 of the continuous active region 300. Therefore, a metal-oxide-semiconductor (MOS) capacitor 520 having a capacitance C2 is formed by the gate structure 510G and the second portion 330. The gate structure 510G and the second portion 330 may both extend lengthwise along a same direction. In embodiments represented in FIG. 5, the gate structure 510G extends lengthwise along the X direction and is disposed adjacent to the gate structure 260G. It is noted that, the gate structure 510G is not in direct contact with the gate structure 260G. For example, the gate structure 510G and the gate structure 260G may be separated by a dielectric layer such as an inter-layer dielectric layer (ILD) having oxygen and silicon. Further, the gate structure 510G fully covers the second portion 330 on all sides to maximize the capacitance C2.

In embodiments represented in FIG. 6, the gate structure 510G includes a gate dielectric layer 610a and a gate electrode layer 610b formed over the gate dielectric layer 610a. In an embodiment, the formation and composition of the gate structure 510G may be similar to those of the gate structure 210G. In some embodiments, the gate dielectric layer 610a, the gate dielectric layer 460a, and the gate dielectric layer 410a may be formed by patterning a dielectric layer (such as silicon dioxide) formed by a same deposition or growth process. In some other implementations, the gate dielectric layer 610a may have a higher dielectric constant than the gate dielectric layer 460a or the gate dielectric layer 410a to further increase the capacitance C2 of the MOS capacitor 520. For example, the gate dielectric layer 610a may include a high-k dielectric layer. A high-k gate dielectric layer, as used herein, includes dielectric material(s) having a high dielectric constant, for example, greater than that of thermal silicon oxide (~3.9). The high-k dielectric layer 610a may include hafnium oxide, titanium oxide (TiO$_2$), hafnium zirconium oxide, tantalum oxide, hafnium silicon oxide (HfSiO4), zirconium oxide, zirconium silicon oxide, lanthanum oxide, aluminum oxide, yttrium oxide, SrTiO$_3$ (STO), BaTiO$_3$ (BTO), BaZrO, hafnium lanthanum oxide, lanthanum silicon oxide, aluminum silicon oxide, hafnium tantalum oxide, hafnium titanium oxide, (Ba,Sr)TiO$_3$ (BST), silicon nitride, silicon oxynitride, combinations thereof, or other suitable materials.

Still referring to FIG. 6, exemplary processes for fabricating the pixel 500 may include performing a first ion implantation process to the substrate 305 to form the second portion 330, forming the gate structures 210G, 260G, and 510G over the substrate 305 after forming the doped second portion 330, and performing a second ion implantation process to the substrate 305 to form the FD 215 and the first portion 325 using the gate structures 210G, 260G, and 510G as part of the implantation mask. The first portion 325 may interface with the second portion 330. In some implementations, there may be an overlap between the first portion 325 and the second portion 330, for example, due to the diffusion of the implanted dopants. The FD 215 and the first portion 325 serve as source/drains of corresponding transistors. The second portion 330 is doped such that the MOS capacitor 520 operates in an accumulation mode to provide a substantially stable capacitance C2. In some embodiments, a doping concentration of the second portion 330 may be about or greater than 1E14 ions/cm$^2$ to ensure that the MOS capacitor 520 remains operating in the accumulation mode. A doping type of the second portion 330 is the same as the doping type of the FD 215 and the first portion 325. For example, in embodiments where the FD 215 and the first portion 325 are N-type doped regions, the second portion 330 is also an N-type doped region, and in embodiments where the FD 215 and the first portion 325 are P-type doped regions, the second portion 330 is also a P-type doped region. In some embodiments, the doping concentration of the FD 215 and the first portion 325 may be between about 1E13 ions/cm$^2$ and 1E16 ions/cm$^2$. The doping concentration of the second portion 330 may be about same as or different from the doping concentration of the first portion 325. In some embodiments, while ensuring that the MOS capacitor 520 remains operating in the accumulation mode, the doping concentration of the second portion 330 may be greater than that of the FD 215 to further increase the capacitance C1 of the junction capacitor 265, thereby further reducing the low conversion gain.

To provide the MOS capacitor 520 with a large capacitance, the gate structure 510G overhangs the second portion 330 to increase the overlapping area therebetween. That is, at least a portion of the gate structure 510G is not disposed directly over the second portion 330 and is disposed outside of the top surface of the second portion 330. The layout shown in FIG. 5 also shows exemplary areal relationship between the second portion 330 and the gate structure 510G. In embodiments represented in FIG. 6, a portion of the gate structure 510G is disposed directly on the isolation structure 405.

An equivalent circuit diagram of the pixel 500 is shown in FIG. 7. The circuit of pixel 500 is similar to that of the pixel 115 shown in FIG. 2 except that the pixel 500 includes a dual conversion gain circuit 250' different from the dual conversion gain circuit 250. More specifically, besides the conversion gain switch 260 and the capacitor 265, the dual conversion gain circuit 250' further includes a MOS capacitor 520 configured to provide a capacitance C2. Both the MOS capacitor 520 and the junction capacitor 265 are electrically coupled to the junction capacitor 218 in parallel. In some implementations, the capacitance C2 is greater than the capacitance C1. The capacitance C1 is associated with the depletion region formed between the portion 340 (including portions 325 and 330, shown in FIG. 6) and the substrate 305. The capacitance C2 is associated with the MOS capacitor 520 formed by the substrate 305 (e.g., the second portion 330 shown in FIG. 6) and the gate structure 510G. As shown in the equivalent circuit diagram in FIG. 7, a first terminal of the MOS capacitor 520 is electrically coupled to the conversion gain switch 260, and a second terminal of the MOS capacitor 520 is grounded (i.e., connected to ground power supply voltage GND). A further simplified equivalent circuit diagram is shown on the right side of FIG. 7, and the MOS capacitor 520 is electrically coupled to the junction capacitor 265 in parallel. Therefore, a total capacitance of the dual conversion gain circuit 250' is equal to a sum of the capacitance C1 and the capacitance C2 (i.e., C1+C2).

When the dual conversion gain switch 260 of the dual conversion gain circuit 250' is turned off by the gain control signal S4, as described above, the pixel 115 has the first conversion gain. When the dual conversion gain switch 260 of the dual conversion gain circuit 250' is turned on by the gain control signal S4, both the junction capacitor 265 and the MOS capacitor 520 are coupled to the FD 215 in parallel, providing the FD 215 with an additional capacitance (i.e., C1+C2). That is, when the dual conversion gain switch 260 is turned on, the total capacitance is equal to a sum of the capacitance of the junction capacitor 218 and the capacitance of dual conversion gain circuit 250' (i.e., C0+C1+C2). The charges transferred by the transfer transistor 210 may be stored in the junction capacitor 218, the junction capacitor 265, and the MOS capacitor 520. Thus, once the junction capacitor 265 and the MOS capacitor 520 are coupled to the FD 215, the conversion gain will decrease from the first conversion gain to a third conversion gain that is lower than the second conversion gain. Thus, the low conversion gain of the pixel 500 is even lower than the low conversion gain of the pixel 115. A ratio of the first conversion gain to the third conversion gain may be between about 10 and about 100. Accordingly, the signal to noise ratio (SNR) and the dynamic range of the pixel 500 are further increased over the pixel 115.

Figure 8:
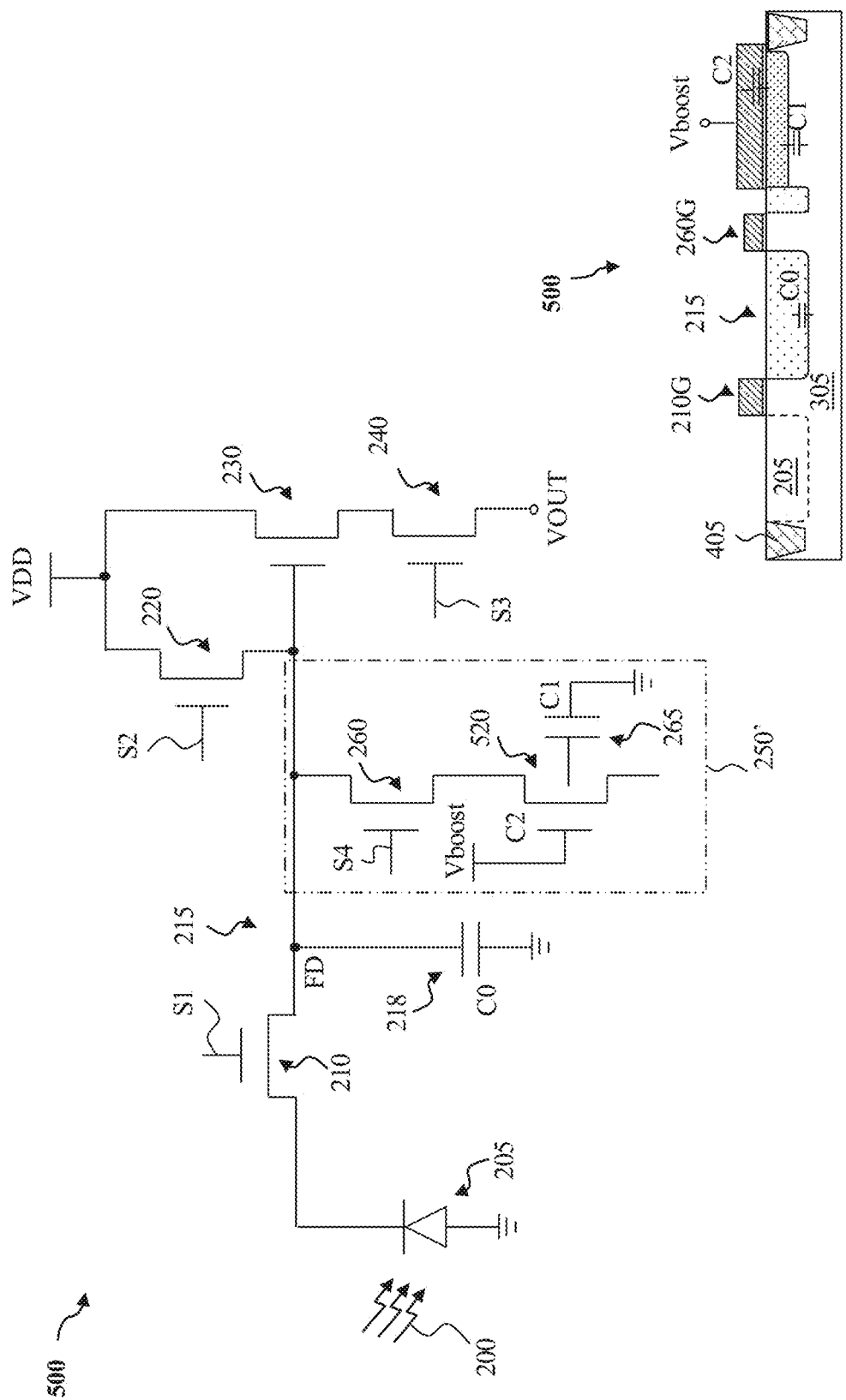
FIG. 8 illustrates an embodiment of the first alternative pixel with an improved charge transferring mechanism, according to various aspects of the present disclosure.

In various implementations, the photodiode 205 may have a high full-well capacity or a low full-well capacity. In either situation, a portion of the charges generated by the photodiode 205 may not be transferred to the FD 215 due to, for example, insufficient capacitance C0 of the FD 215. Thus, when the transfer transistor 210 is turned on to transfer the charges generated by the photodiode 205 to the FD 215, a portion of the charges may be hardly transferred in some instances. This portion of charges remains as residual electrons in the photodiode 205 and may lead to lag or dark signals, which might degrade the sensitivity of the image sensor 100 and induce distortion of image data. FIG. 8 illustrates an embodiment of the pixel 500 with an improved charge transferring mechanism where charge transferring from the photodiode 205 to the FD 215 is boosted to reduce or substantially eliminate the residual electrons. As shown in FIG. 8, while the transfer transistor 210 is turned on for charge transferring, the gate structure 510G of the MOS capacitor 520 is switched to receive a voltage Vboost. The cross-sectional view of the pixel 500 is shown on the right side of FIG. 8. Vboost is not equal to the ground voltage GND. In an embodiment, the voltage Vboost is a positive voltage and greater than the ground voltage GND. With the voltage Vboost applied to the MOS capacitor 520 during charge transferring, the energy level of the FD 215 may be decreased, more electrons can be attracted to the gate structure 510G and the residual electrons can thus be transferred to the FD 215 and stored in the FD 215, the junction capacitor 265, and the MOS capacitor 520, increasing the full-well capacity. The transfer transistor 210 and a switch (not shown) that is configured to electrically couple the gate structure 510G of the MOS capacitor 520 to the voltage Vboost may be turned off after the charge transferring has completed.

Figure 9:
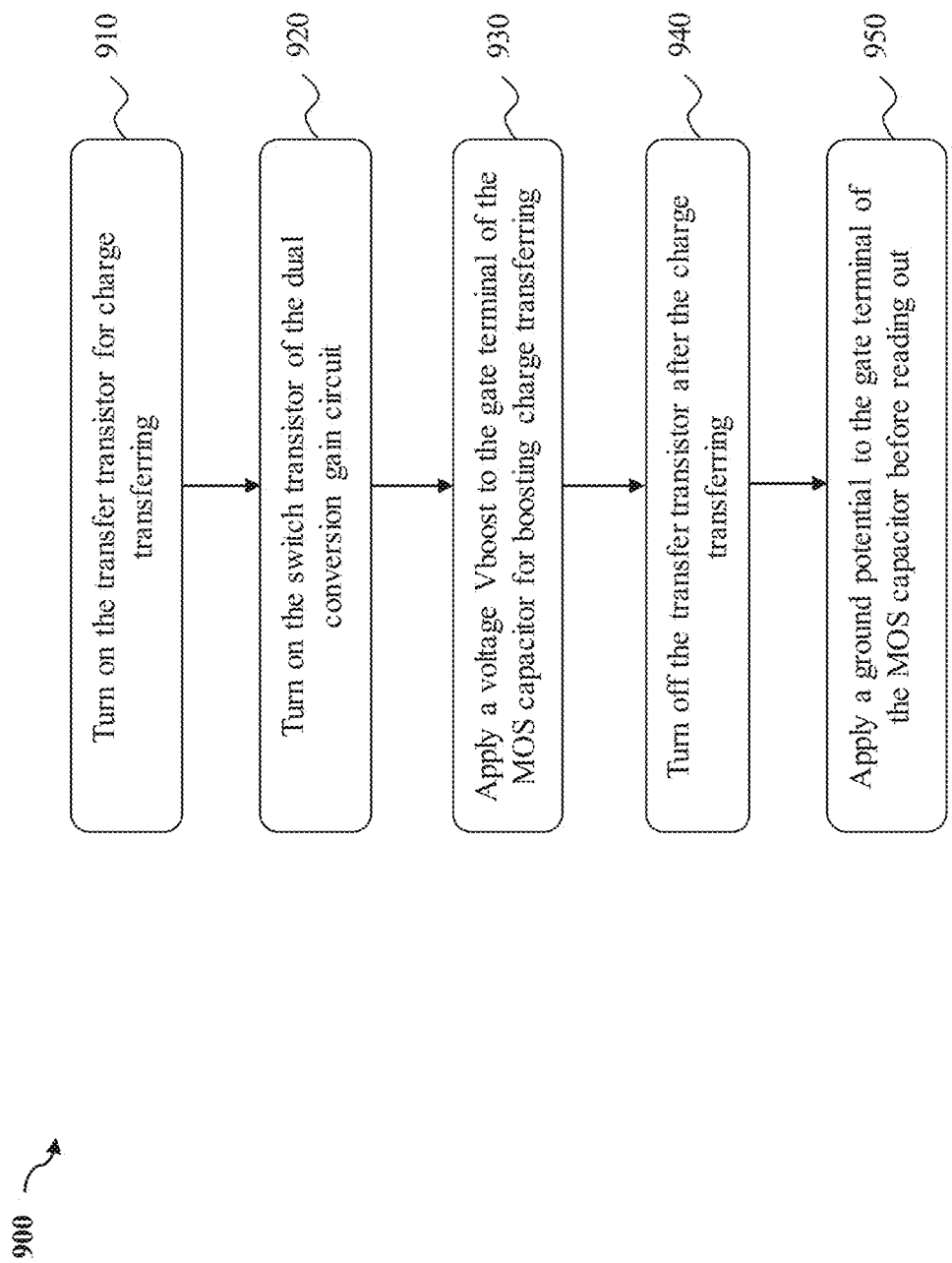
FIG. 9 depicts a flow chart of an exemplary method for operating the first alternative pixel, according to various aspects of the present disclosure.

FIG. 9 depicts a flow chart of an exemplary method 900 for operating the pixel 500, according to various aspects of the present disclosure. Method 900 is merely an example and is not intended to limit the present disclosure to what is explicitly illustrated therein. Additional steps (e.g., resetting the FD 215) may be provided before, during, and after the method 900, and some steps described can be replaced, eliminated, or moved around for additional embodiments of the methods. Not all steps are described herein in detail for reasons of simplicity. The method 900 includes a block 910 where the transfer transistor 210 is turned on in response to the control signal S1 to transfer charges generated by the photodiode 205. The method 900 includes a block 920 where the conversion gain switch 260 of the dual conversion gain circuit 250' is turned on (by the gain control signal S4) to transfer a portion of the charges from the FD 215 to the capacitors of the dual conversion gain circuit 250'. The method 900 also includes a block 930 where the voltage Vboost is applied to the second terminal of the MOS capacitor 520 of the dual conversion gain circuit 250' to boost the charge transferring. The method 900 also includes a block 940 where the transfer transistor 210 is turned off (by the control signal S1) after the charge transferring has completed, which can be determined by a timer or by other control mechanism. The method 900 also includes a block 950 where the second terminal of the MOS capacitor 520 of the dual conversion gain circuit 250' is grounded before reading out the signal from the pixel 500.

Figure 10:
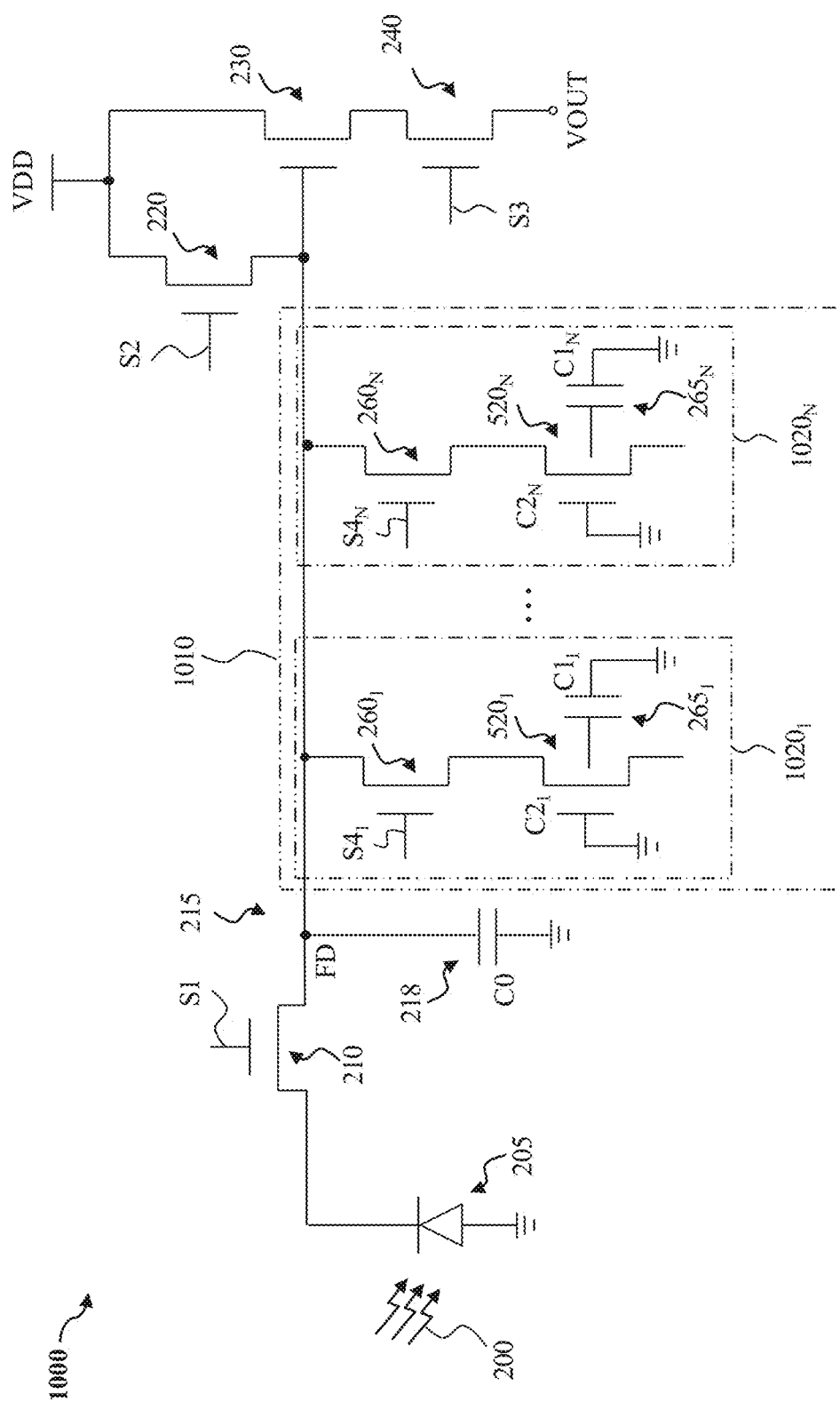
FIG. 10 illustrates an equivalent circuit diagram of a second alternative pixel, according to various aspects of the present disclosure.

FIG. 10 illustrates an equivalent circuit diagram of a second alternative pixel 1000, according to various aspects of the present disclosure. In embodiments represented in FIG. 10, the pixel 1000 is similar to the pixel 500 except that the pixel 1000 includes a conversion gain circuit 1010 that is different from the dual conversion gain circuit 250' shown in FIGS. 7-8. The conversion gain circuit 1010 is electrically coupled to the FD 215 and configured to provide the pixel 115 with more than two conversion gains in response to different gain control signals $S4_1, \ldots, S4_N$, where N is an integer greater than 1. More specifically, the conversion gain circuit 1010 includes N dual conversion gain circuits $1020_1, \ldots, 1020_N$ electrically connected in parallel. In this depicted example, each of the dual conversion gain circuits $1020_1$-$1020_N$ may be similar to the dual conversion gain circuit 250'. For example, each of the dual conversion gain circuits $1020_1$-$1020_N$ includes a conversion gain switch (e.g., conversion gain switch $260_1, \ldots$ conversion gain switch $260_N$) electrically coupled to the FD 215, a first capacitor (e.g., junction capacitor $265_1, \ldots$ junction capacitor $265_N$), and a second capacitor (e.g., MOS capacitor $520_1, \ldots$ MOS capacitor $520_N$). Each of the conversion gain switches $260_1$-$260_N$ may be similar to the conversion gain switch $260$, each of the first capacitors $265_1$-$265_N$ may be similar to the junction capacitor 265, and each of the second capacitors $520_1$-$520_N$ may be similar to the MOS capacitor 520. Each dual conversion gain circuit $250_i$ (i=1, . . . N) provides a capacitance of $C1_i$-$C2_i$ when its respective conversion gain switch $260_i$ is turned on and provides a negligible capacitance when its respective conversion gain switch $260_i$ is turned off. Here, $C1_i$ is the capacitance of the corresponding first capacitor $265_i$, and $C2_i$ is the capacitance of the corresponding second capacitor $520_i$. The capacitance $C1_i$-$C2_i$ of each dual conversion gain circuit $250_i$ (i=1, . . . N) is connected with the capacitor C0 in parallel. Each of the dual conversion gain circuits $250_1$-$250_N$ may be independently controlled such that different capacitances may be added to the FD 215, leading to multiple conversion gains. For example, when the conversion gain switch $260_1$ and conversion gain switch $260_N$ are both turned on by a respective gain control signal $S4_1$ and $S4_N$, the total capacitance added to the FD 215 may be equal to a sum of the capacitance $C1_1$, $C2_1$, $C1_N$, and $C2_N$ (i.e., $C1_1+C2_1+C1_N+C2_N$). The capacitances $C1_1$, $C2_1$, $C1_N$, $C2_N$ are the corresponding capacitance of the junction capacitor $265_1$, MOS capacitor $520_1$, junction capacitor $265_N$, and MOS capacitor $520_N$, respectively. It is noted that, the total capacitance of each of the dual conversion gain circuits $250_1$-$250_N$ may be same or different. For example, a total capacitance (i.e., $C1_1+C2_1$) of the dual conversion gain circuit $250_1$ may be equal to or different than a total capacitance (i.e., $C1_N+C2_N$) of the dual conversion gain circuit $250_N$. In situations where both the conversion gain switch $260_1$ and the conversion gain switch $260_N$ are turned off, a first conversion gain is achieved. In situations where the conversion gain switch $260_1$ is turn on and the conversion gain switch $260_N$ is turned off, a second conversion gain is achieved. The second conversion gain is lower than the first conversion gain. In situations where the conversion gain switch $260_1$ is turn off and conversion gain switch $260_N$ is turned on, a third conversion gain is achieved. The third conversion gain is lower than the first conversion gain. In situations where both the conversion gain switch $260_1$ and the conversion gain switch $260_N$ are turned on, a fourth conversion gain is achieved. The fourth conversion gain is lower than the first, second, and the third conversion gain. In embodiments where the total capacitance of the dual conversion gain circuit $250_1$ is different than a total capacitance of the dual conversion gain circuit $250_N$, the third conversion gain is different than the second conversion gain, and "quad conversion gain" is achieved beyond dual conversion gain. In embodiments where the total capacitance of the dual conversion gain circuit $250_1$ is equal to a total capacitance of the dual conversion gain circuit $250_N$, the third conversion gain is equal to the second conversion gain, and "triple conversion gain" is achieved beyond dual conversion gain.

Figure 11:
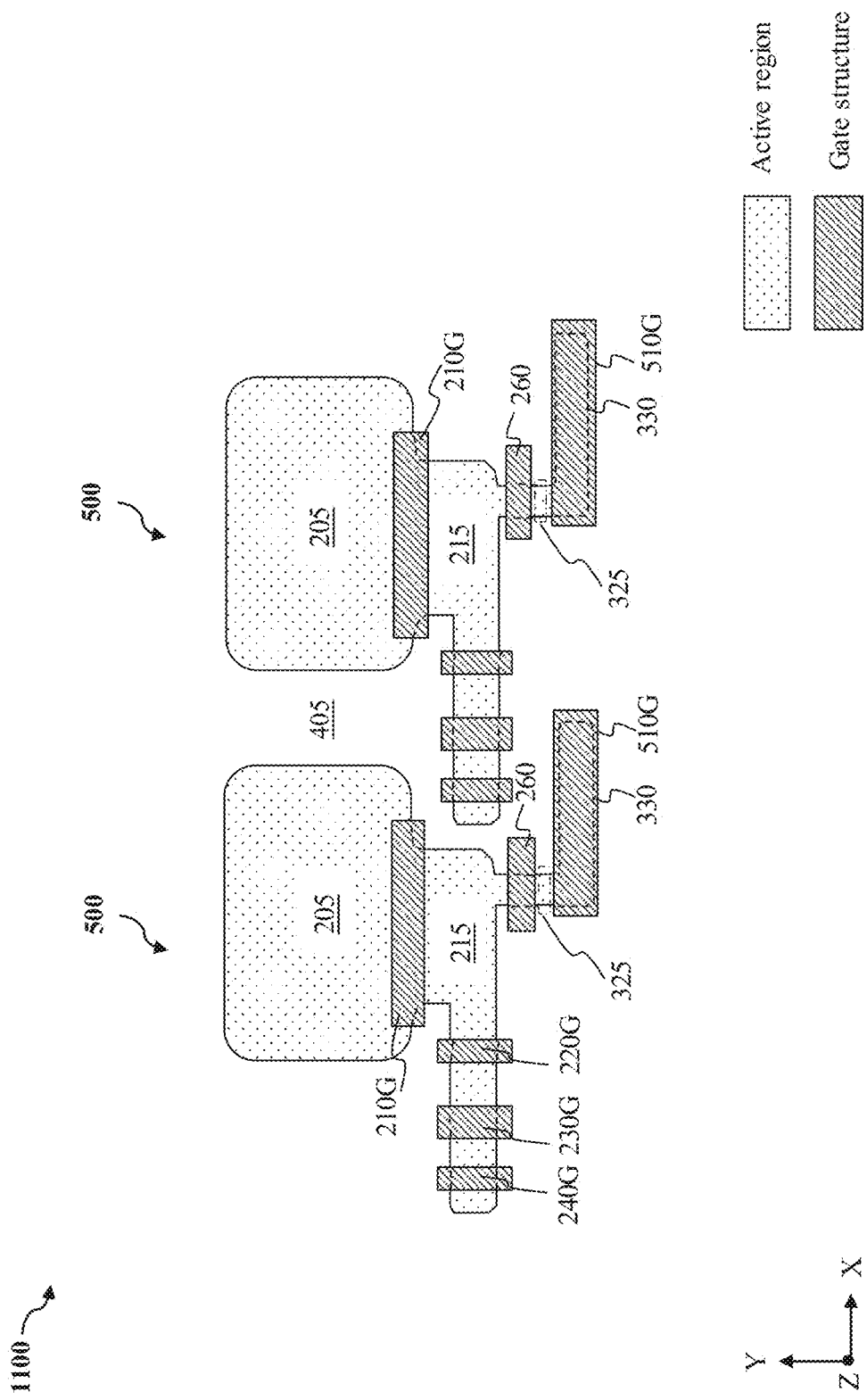
FIG. 11 illustrates a fragmentary layout of an image sensor array of the image sensor, according to various aspects of the present disclosure.

FIG. 11 illustrates a fragmentary layout of an image sensor array 1100 of the image sensor, according to various aspects of the present disclosure. In embodiments represented in FIG. 11, the image sensor array 1100 includes two adjacent pixels 500. The active regions of the two adjacent pixels 500 are separated by isolation structures (e.g., isolation structure 405). It is noted that, not all isolation structures are explicitly shown in the FIG. 11. In embodiments represented in FIG. 11, a first pixel 500 is disposed laterally adjacent to a second pixel 500 along the X direction. Alternatively, the two pixels 500 may be disposed adjacent to each other along the Y direction. In some embodiment, the image sensor array 1100 includes rows (along the X direction) and columns (along the Y direction) of pixels 500.

Figure 12:
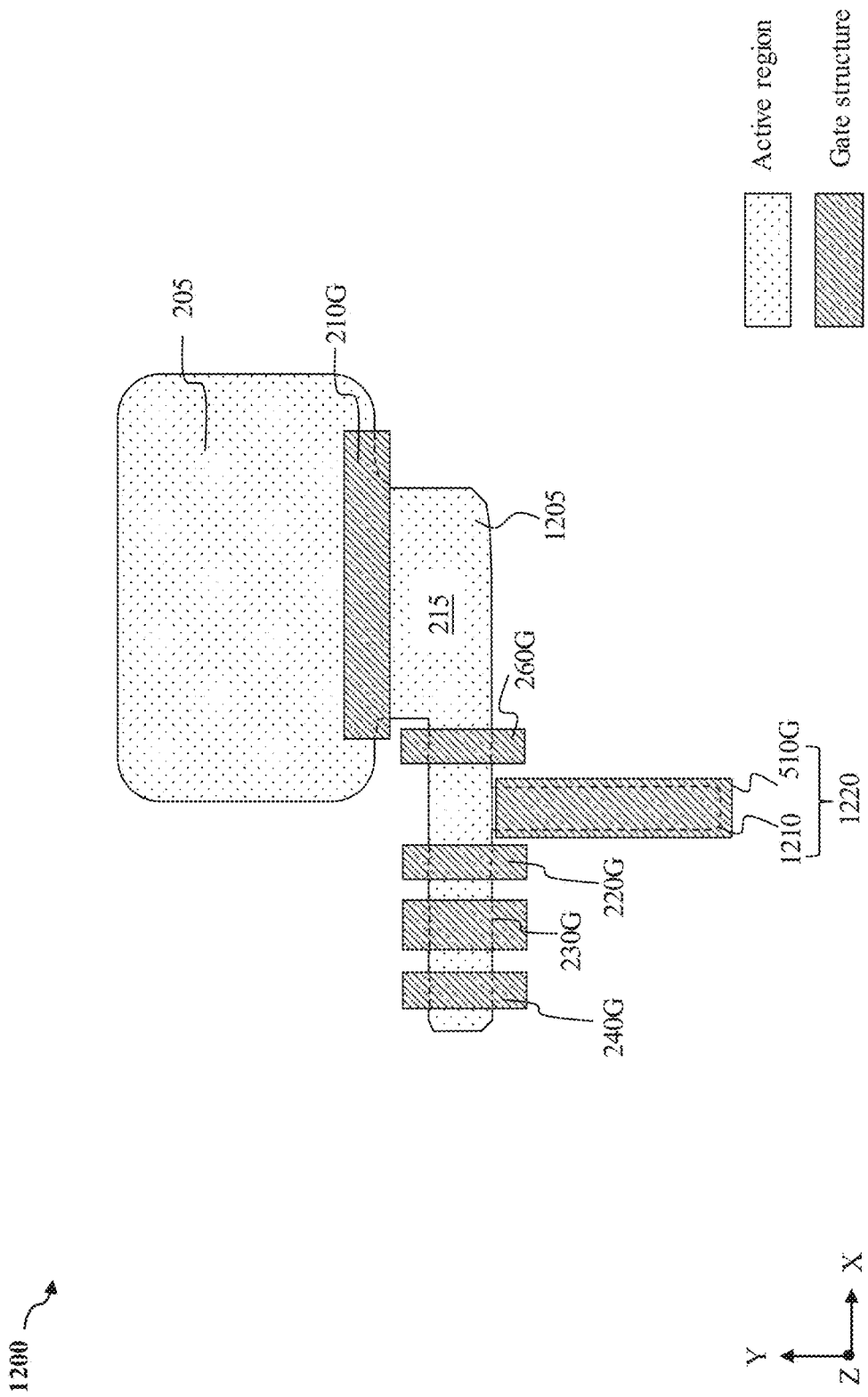
FIG. 12 depicts an exemplary layout of a third alternative pixel, according to various aspects of the present disclosure.

FIG. 12 depicts an exemplary layout of a pixel 1200. The layout of the pixel 1200 is similar to that of the pixel 500 shown in FIG. 5 except for the layout pattern of the continuous active region 1205 and the arrangement of the conversion gain switch 260 and the MOS capacitor 520 formed in and over the continuous active region 1205. The continuous active region 1205 is similar to the continuous active region 300 shown in FIG. 5. For example, the arrangement of the photodiode 205, the transfer transistor 210, the reset transistor 220, the drive transistor 230, and the select transistor 240 formed in and over the active region 1205 are substantially same to the arrangement of the photodiode 205, the transfer transistor 210, the reset transistor 220, the drive transistor 230, and the select transistor 240 formed in and over the active region 300 in FIG. 5.

In embodiments represented in FIG. 12, the gate structure 260G of the conversion gain switch 260 is disposed between the FD 215 and the gate structure 220G of the reset transistor 220. The gate structure 220G extends lengthwise along a first direction (e.g., the Y direction) and the gate structure 260G extends lengthwise substantially parallel to the first direction. The reset transistor 220 and the conversion gain switch 260 share a source/drain region (i.e., the portion of the active region 1205 disposed between the gate structure 220G and the gate structure 260G, as shown in the top layout view). A portion 1210 of the continuous active region 1205 ("the portion 1210") extends outwardly from the shared source/drain region. In embodiments represented in FIG. 12, the portion 1210 extends lengthwise along the Y direction. The doping concentration of the portion 1210 in FIG. 12 may be similar to the second portion 330 described with reference to FIG. 6. The gate structure 510G is disposed directly on the portion 1210 and extends lengthwise along the Y direction. The substrate 305 and the shared source/drain region and the portion 1210 form a junction capacitor (not explicitly labeled) similar to the junction capacitor 265, and the gate structure 510G and the portion 1210 form a MOS capacitor 1220 similar to the MOS capacitor 520. In this arrangement, the junction capacitor and the MOS capacitor 1220 may be reset together with the FD 215 by the reset transistor 220 even when a lower conversion gain mode is not triggered. It is noted that, the active region 1205 of the pixel 1200 is also a continuous active region hosting the photodiode, all the transistors and junction capacitors of the pixel 1200, and no isolation features (e.g., STI) is formed to divide the continuous active region 1205 into pieces.

In embodiments represented in FIGS. 3, 5, 11, and 12, the first portion 325 and the second portion 330 may be collectively referred to as one of the two source/drain regions of the switch transistor 260. In some other embodiments represented in FIGS. 3, 5, 11, and 12, the first portion 325 may be referred to as one of the two source/drain regions of the switch transistor 260. In embodiments represented in FIGS. 3, 5, 11, and 12, the first portion 325 extends lengthwise along a first direction (e.g., Y direction) and the second portion 330 extends lengthwise along a second direction (e.g., X direction) that is substantially perpendicular to the first direction to scale down the dimension of the pixel 115. In some other embodiments, both the first portion 325 and the second portion 330 may extend lengthwise along the first direction, the first direction may be, for example, X direction, or Y direction.

Figure 13:
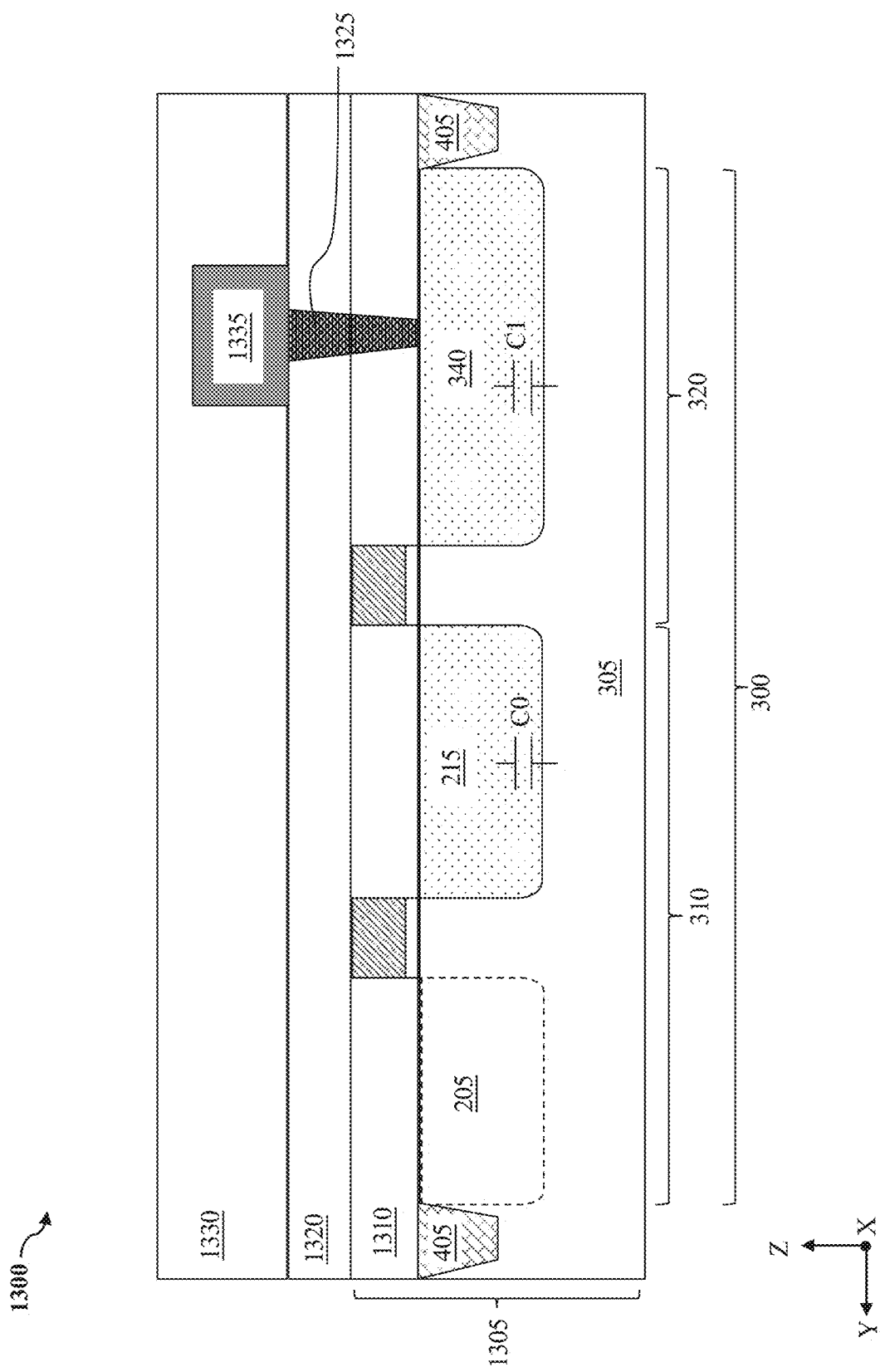
FIG. 13 depicts a cross-sectional view of a fourth alternative pixel, according to various aspects of the present disclosure.

In the above embodiments, the capacitance C2 is provided by the MOS capacitor 520. In some other implementations, the capacitance C2 may be provided by a metal-insulator-metal (MIM) capacitor or a metal-oxide-metal (MOM) capacitor. FIG. 13 depicts a cross-sectional view of a pixel 1300 having a MIM capacitor or a MOM capacitor, according to various aspects of the present disclosure. In embodiments represented in FIG. 13, the pixel 1300 includes a device structure 1305 substantially same to the pixel 115 shown in FIG. 4. The pixel 1300 further includes a first dielectric layer 1310 formed over the device structure 1305 and a second dielectric layer 1320 formed over the first dielectric layer 1310. The first dielectric layer 1310 and the second dielectric layer 1320 may be deposited by a CVD process, a PECVD process or other suitable deposition technique and may include silicon oxide, a low-k dielectric material, TEOS formed oxide, doped silicon oxide (e.g., BPSG, FSG, PSG, BSG, etc.), other suitable dielectric materials, or combinations thereof.

The pixel 1300 also includes a number of contacts or vias that electrically connect the components (e.g., gate structures, the source/drains, or other features) of the device structure 1305. For example, the pixel 1300 includes a contact 1325 extending through the first dielectric layer 1310 and the second dielectric layer 1320 and electrically coupled to the portion 340 (e.g., N-doped region) in the substrate 305.

The pixel 1300 also includes a multi-layer interconnect structure (MLI) 1330 formed over the second dielectric layer 1320. The MLI 1330 may include a number of conductive features (e.g., metal lines, contact vias) embedded in a number of intermetal dielectric layers. The MLI 1330 electrically couples various devices (for example, transistors, photodiodes) and/or components (for example, gates and/or source/drains) of an IC device. The MLI 1330 may include a MIM capacitor 1335 or a MOM capacitor 1335 formed by conductive features and dielectric layers of the MLI 1330. For example, a MIM capacitor 1335 may be formed by vertically stacking a metal plate over a dielectric layer over another metal plate. For example, a MOM capacitor 1335 may be formed by horizontally (or laterally) sandwiching a dielectric layer by two metal plates. The MIM capacitor 1335 or a MOM capacitor 1335 is electrically connected to the portion 340 in the substrate 305. By providing the MIM capacitor 1335 or a MOM capacitor 1335, the capacitance C2 may be obtained.

It is noted that, although the pixels described with reference to FIGS. 2-13 include the transfer transistor 210, in some other implementations, the pixels may not include the transfer transistor 210. In embodiments represented in FIGS. 2-13, each pixel includes a corresponding photodiode 205, an FD 215, a reset transistor 220, a drive transistor 230, a select transistor 240, and a conversion gain circuit (e.g., conversion gain circuit 250, 250', 1010). In some other implementations, each pixel may include a corresponding photodiode 205 and an FD 215, and may share one or more of the reset transistor 220, the drive transistor 230, the select transistor 240, and the conversion gain circuit (e.g., conversion gain circuit 250, 250', or 1010) with adjacent pixels. For example, 2 pixels, 4 pixels, 9 pixels, or 16 pixels may share a conversion gain circuit (e.g., conversion gain circuit 250, 250', or 1010).

Based on the above descriptions, it can be seen that the present disclosure offers advantages. It is understood, however, that other embodiments may offer additional advantages, and not all advantages are necessarily disclosed herein, and that no particular advantage is required for all embodiments. For example, the present disclosure provides a pixel that includes a continuous active region and a portion of the continuous active region is configured to introduce a junction capacitance that can be controllably added to a floating diffusion region by a gain control signal applied to a gain conversion switch. In another embodiment, a gate structure is formed directly over the portion of the continuous active region to introduce a MOS capacitor that is electrically connected to the junction capacitance in parallel to further reduce the low conversion gain. Therefore, the pixel may operate in a high conversion gain mode and a low conversion gain mode, leading to a higher ratio of the high conversion gain to the low conversion gain (i.e., the high conversion gain divided by the low conversion gain) and thus leading to a higher dynamic range. Therefore, the image sensor may be able to, for example, recognize fingerprints under various conditions.

The present disclosure provides many different embodiments. In one exemplary aspect, the present disclosure is directed to an image sensor device. The image sensor device includes a photosensitive device configured to generate charges in response to incident light, a floating diffusion region electrically coupled to the photosensitive device and configured to store the charges, and a gain conversion circuit. The gain conversion circuit includes a switch transistor having a first terminal, a second terminal, and a control terminal, wherein the first terminal is electrically coupled to the floating diffusion region, a first capacitive element including a third terminal and a fourth terminal, the third terminal being electrically coupled to the second terminal, the fourth terminal being electrically coupled to a reference voltage, and a second capacitive element electrically coupled to the first capacitive element in parallel.

In some embodiments, the first capacitive element may include a first doped portion in a semiconductor substrate, and the first doped portion may be disposed in an active region extending from an active region of the floating diffusion region. In some embodiments, the second capacitive element may include a capacitance associated with the first doped portion and a gate electrode disposed over the first doped portion. In some embodiments, the floating diffusion region may include a third capacitive element associated with a second doped portion in the semiconductor substrate. In some embodiments, a doping concentration of the second doped portion may be less than a doping concentration of the first doped portion. In some embodiments, a capacitance of the second capacitive element is greater than a capacitance of the first capacitive element, and the capacitance of the first capacitive element is greater than a capacitance of the third capacitive element. In some embodiments, the second capacitive element may include a metal-oxide-semiconductor (MOS) capacitor. The MOS capacitor may include a fifth terminal electrically coupled to the reference voltage and a sixth terminal coupled to the second terminal. In some embodiments, the image sensor device has a first conversion gain when the switch transistor is turned off in response to a first control signal applied to the control terminal and a second conversion gain when the switch transistor is turned on in response to a second control signal applied to the control terminal. In some embodiments, a ratio of the first conversion gain to the second conversion gain may be between about 10 and about 100. In some embodiments, the gain conversion circuit may be a first gain conversion circuit, the switch transistor is a first switch transistor and is operative in response to a first control signal received by the control terminal of the first switch transistor. The image sensor device may include a second gain conversion circuit electrically coupled to the floating diffusion region and connected to the gain conversion circuit in parallel. The second gain conversion circuit may provide an additional capacitive element configured to store a portion of the charges in response to a second control signal applied to a second switch transistor of the second gain conversion circuit. In some embodiments, the image sensor device has a first conversion gain when both the first switch transistor and the second switch transistor are turned off, a second conversion gain when the first switch transistor is turned on and the second switch transistor is turned off, and a third conversion gain when both the first switch transistor and the second switch transistor are turned on. The first conversion gain may be greater than the second conversion gain, and the second conversion gain may be greater than the third conversion gain.

In another exemplary aspect, the present disclosure is directed to an image sensor device. The image sensor device includes a substrate having a continuous active region. The continuous active region includes a first region and a second region, where the second region is a continuous extension of the first region. The image sensor device also includes a photodiode, a reset transistor, a drive transistor, and a select transistor formed in and over the first region. The photodiode and the reset transistor define a floating diffusion region therebetween. The image sensor device also includes a switch transistor formed in and over the second region. The switch transistor includes a first source/drain region and a second source/drain region. The first source/drain region is included in the floating diffusion region. The image sensor device also includes a doped region formed in the second region and interfacing the second source/drain region. The image sensor device also includes a first gate structure disposed directly over the doped region.

In some embodiments, the first gate structure may be disposed between a gate structure of the reset transistor and a gate structure of the switch transistor. In some embodiments, the first gate structure may include a gate dielectric layer on the substrate and a polysilicon layer on the gate dielectric layer. In some embodiments, a doping concentration of the doped region may be greater than a doping concentration of the second source/drain region. In some embodiments, the image sensor device may also include a transfer transistor disposed over the first portion. A gate structure of the reset transistor and a gate structure of the transfer transistor define the floating diffusion region therebetween. The gate structure of the transfer transistor may extend lengthwise along a first direction, and the first gate structure may extend lengthwise along a second direction substantially parallel to the first direction.

In yet another exemplary aspect, the present disclosure is directed to an image sensor device that includes a number of pixels. Each pixel includes a substrate having a continuous active region, a floating diffusion region in the continuous active region, a first gate electrode disposed over the continuous active region and adjacent to a first side of the floating diffusion region, a switch transistor having a gate electrode disposed over the continuous active region and adjacent to a second side of the floating diffusion region. The second side is different from the first side. The switch transistor also has a first source/drain region and a second source/drain region, the first source/drain region is included in the floating diffusion region and the second source/drain region is disposed in the continuous active region. Each pixel also includes a second gate electrode disposed over the second source/drain region.

In some embodiments, the image sensor device may also include a reset transistor having a gate electrode disposed over the continuous active region. The gate electrode of the reset transistor may extend lengthwise along a first direction, and the first gate electrode and the second gate electrode may extend lengthwise along a second direction substantially perpendicular to the first direction. In some embodiments, the image sensor device may also include a reset transistor having a gate electrode disposed over the continuous active region. The gate electrode of the reset transistor may be disposed adjacent to a third side of the floating diffusion region, the third side being different from the first side and the second side. In some embodiments, the image sensor device may also include a reset transistor having a gate electrode disposed over the continuous active region. The second gate electrode may be disposed between the gate electrode of the reset transistor and the gate electrode of the switch transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
    a photosensitive device configured to generate charges in response to incident light;
    a floating diffusion region electrically coupled to the photosensitive device and configured to store the charges; and
    a gain conversion circuit, wherein the gain conversion circuit includes:
        a switch transistor having a first terminal, a second terminal, and a control terminal, wherein the first terminal is electrically coupled to the floating diffusion region,
        a first capacitive element including a third terminal and a fourth terminal, the third terminal being electrically coupled to the second terminal, the fourth terminal being electrically coupled to a reference voltage, and
        a second capacitive element electrically coupled to the first capacitive element in parallel,
    wherein the first capacitive element comprises a first doped portion in a semiconductor substrate, and the first doped portion is disposed in an active region extending from the floating diffusion region,
    wherein the floating diffusion region includes a third capacitive element associated with a second doped portion in the semiconductor substrate, and
    wherein a capacitance of the second capacitive element is greater than a capacitance of the first capacitive element, and the capacitance of the first capacitive element is greater than a capacitance of the third capacitive element.

2. The image sensor device of claim 1, wherein the second capacitive element comprises the first doped portion and a gate electrode disposed over the first doped portion.

3. The image sensor device of claim 2, wherein a doping concentration of the first doped portion is greater than a threshold such that the second capacitive element operates in an accumulation mode.

4. The image sensor device of claim 1, wherein a doping concentration of the second doped portion is less than a doping concentration of the first doped portion.

5. The image sensor device of claim 1,
    wherein the second capacitive element comprises a metal-oxide-semiconductor (MOS) capacitor,
    wherein the MOS capacitor comprises a fifth terminal electrically coupled to the reference voltage and a sixth terminal coupled to the second terminal.

6. The image sensor device of claim 1, wherein, the image sensor device has a first conversion gain when the switch transistor is turned off in response to a first control signal applied to the control terminal and a second conversion gain when the switch transistor is turned on in response to a second control signal applied to the control terminal.

7. The image sensor device of claim 6, wherein a ratio of the first conversion gain to the second conversion gain is between about 10 and about 100.

8. The image sensor device of claim 1, wherein the gain conversion circuit is a first gain conversion circuit, the switch transistor is a first switch transistor and is operative in response to a first control signal received by the control terminal of the first switch transistor, the image sensor device further comprising:
- a second gain conversion circuit electrically coupled to the floating diffusion region and connected to the first gain conversion circuit in parallel,
- wherein the second gain conversion circuit provides an additional capacitive element configured to store a portion of the charges in response to a second control signal applied to a second switch transistor of the second gain conversion circuit.

9. The image sensor device of claim 8,
- wherein the image sensor device has a first conversion gain when both the first switch transistor and the second switch transistor are turned off,
- wherein the image sensor device has a second conversion gain when the first switch transistor is turned on and the second switch transistor is turned off, and
- wherein the image sensor device has a third conversion gain when both the first switch transistor and the second switch transistor are turned on, the first conversion gain is greater than the second conversion gain, and the second conversion gain is greater than the third conversion gain.

10. An image sensor device, comprising:
- a substrate comprising a continuous active region, the continuous active region comprising a first region and a second region, wherein the second region is a continuous extension of the first region;
- a photodiode, a reset transistor, a drive transistor, and a select transistor formed in and over the first region, wherein the photodiode and the reset transistor define a floating diffusion region therebetween;
- a switch transistor formed in and over the second region and comprising a first source/drain region and a second source/drain region, wherein the first source/drain region is included in the floating diffusion region;
- a doped region formed in the second region and interfacing the second source/drain region; and
- a first gate structure disposed directly over the doped region,
- wherein a doping concentration of the doped region is greater than a doping concentration of the second source/drain region.

11. The image sensor device of claim 10, wherein the first gate structure is disposed between a gate structure of the reset transistor and a gate structure of the switch transistor.

12. The image sensor device of claim 10, wherein the first gate structure comprises a gate dielectric layer on the substrate and a polysilicon layer on the gate dielectric layer.

13. The image sensor device of claim 10, further comprising:
- a transfer transistor formed in and over the first region,
- wherein a gate structure of the reset transistor and a gate structure of the transfer transistor define the floating diffusion region therebetween,
- wherein the gate structure of the transfer transistor extends lengthwise along a first direction, and the first gate structure extends lengthwise along a second direction substantially parallel to the first direction.

14. An image sensor device, comprising:
a plurality of pixels, wherein each pixel of the plurality of pixels includes:
- a substrate having a continuous active region;
- a floating diffusion region in the continuous active region;
- a first gate structure disposed over the continuous active region and adjacent to a first side of the floating diffusion region;
- a switch transistor having a second gate structure disposed over the continuous active region and adjacent to a second side of the floating diffusion region, the second side being different from the first side, wherein the second gate structure extends lengthwise along a first direction, wherein the switch transistor has a first source/drain region and a second source/drain region, wherein the first source/drain region is included in the floating diffusion region, and the second source/drain region is disposed in the continuous active region;
- a doped region disposed in the continuous active region and extending from the second source/drain region, wherein the doped region extends lengthwise along the first direction; and
- a third gate structure disposed directly over the doped region, wherein, in a top view, the third gate structure fully covers the doped region.

15. The image sensor device of claim 14, further comprising:
- a reset transistor having a fourth gate structure disposed over the continuous active region,
- wherein the fourth gate structure extends lengthwise along a second direction substantially perpendicular to the first direction.

16. The image sensor device of claim 14, further comprising:
- a reset transistor having a fourth gate structure disposed over the continuous active region,
- wherein the fourth gate structure is disposed adjacent to a third side of the floating diffusion region, the third side being different from the first side and the second side.

17. The image sensor device of claim 14, further comprising:
- a reset transistor having a fourth gate structure disposed over the continuous active region,
- wherein the third gate structure is disposed between the fourth gate structure and the second gate structure.

* * * * *